(12) United States Patent
Wang et al.

(10) Patent No.: US 12,216,157 B2
(45) Date of Patent: Feb. 4, 2025

(54) PACKAGE STRUCTURE AND TESTING METHOD

(71) Applicant: Advanced Semiconductor Engineering, Inc., Kaohsiung (TW)

(72) Inventors: Chen-Chao Wang, Kaohsiung (TW); Tsung-Tang Tsai, Kaohsiung (TW); Chih-Yi Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/236,930

(22) Filed: Aug. 22, 2023

(65) Prior Publication Data

US 2023/0393194 A1    Dec. 7, 2023

Related U.S. Application Data

(63) Continuation of application No. 16/812,232, filed on Mar. 6, 2020, now Pat. No. 11,733,294.

(51) Int. Cl.
| | |
|---|---|
| *H01L 23/498* | (2006.01) |
| *G01R 31/28* | (2006.01) |
| *H01L 23/00* | (2006.01) |
| *H01L 23/538* | (2006.01) |
| *H01L 23/552* | (2006.01) |
| *H01L 25/18* | (2023.01) |

(Continued)

(52) U.S. Cl.
CPC .... *G01R 31/2896* (2013.01); *H01L 23/49822* (2013.01); *H01L 23/5383* (2013.01); *H01L 23/5386* (2013.01); *H01L 23/552* (2013.01); *H01L 24/16* (2013.01); *H01L 25/18* (2013.01); *H01L 21/563* (2013.01); *H01L 23/3185* (2013.01); *H01L 23/3192* (2013.01); *H01L 2224/16227* (2013.01)

(58) Field of Classification Search
CPC ........... H01L 23/49822; H01L 23/5383; H01L 23/5386
See application file for complete search history.

(56) References Cited

U.S. PATENT DOCUMENTS

| | | |
|---|---|---|
| 2012/0097944 A1 | 4/2012 | Lin et al. |
| 2013/0106459 A1 | 5/2013 | Tseng et al. |
| 2018/0358303 A1 | 12/2018 | Gu et al. |

OTHER PUBLICATIONS

Non-Final Office Action for U.S. Appl. No. 16/812,232, issued Oct. 3, 2022, 9 pages.

(Continued)

*Primary Examiner* — Errol V Fernandes
(74) *Attorney, Agent, or Firm* — FOLEY & LARDNER LLP

(57) ABSTRACT

A package structure and a testing method are provided. The package structure includes a wiring structure, a first electronic device and a second electronic device. The wiring structure includes at least one dielectric layer, at least one conductive circuit layer in contact with the dielectric layer, and at least one test circuit structure in contact with the dielectric layer. The test circuit structure is disposed adjacent to the interconnection portion of the conductive circuit layer. The first electronic device is electrically connected to the wiring structure. The second electronic device is electrically connected to the wiring structure. The second electronic device is electrically connected to the first electronic device through the interconnection portion of the conductive circuit layer.

20 Claims, 22 Drawing Sheets

(51) Int. Cl.
  *H01L 21/56* (2006.01)
  *H01L 23/31* (2006.01)

(56) References Cited

OTHER PUBLICATIONS

Notice of Allowance for U.S. Appl. No. 16/812,232, issued Apr. 3, 2023, 8 pages.

PACKAGE STRUCTURE AND TESTING METHOD

CROSS-REFERENCE TO RELATED APPLICATION

This application is a continuation of U.S. patent application Ser. No. 16/812,232, filed Mar. 6, 2020 the contents of which is incorporated herein by reference in its entirety.

BACKGROUND

1. Field of the Disclosure

The present disclosure relates to a package structure, and a testing method, and to a package structure including a wiring structure with at least one test circuit structure, and a method for testing the same.

2. Description of the Related Art

Along with the rapid development in electronics industry and the progress of semiconductor processing technologies, semiconductor package structures are integrated with an increasing number of electronic components or electronic devices to achieve improved electrical performance and additional functions. Accordingly, a warpage of the semiconductor package structure may occur during the thermal process. Since a rigidity or stiffness of the semiconductor package structure is relatively low, a crack may be formed at the top surface of the semiconductor package structure or in a protection material and extend or grow into the interior of the semiconductor package structure. If the crack reaches the semiconductor package structure, the conductive circuit layer in the semiconductor package structure may be cracked or broken, which may result in an open circuit and render the semiconductor package structure inoperative. Thus, a yield of the semiconductor package structure may decrease.

SUMMARY

In some embodiments, a package structure includes a wiring structure, a first electronic device and a second electronic device. The wiring structure includes at least one dielectric layer, at least one conductive circuit layer in contact with the dielectric layer, and at least one test circuit structure in contact with the dielectric layer. The test circuit structure is disposed adjacent to the interconnection portion of the conductive circuit layer. The first electronic device is electrically connected to the wiring structure. The second electronic device is electrically connected to the wiring structure. The second electronic device is electrically connected to the first electronic device through the interconnection portion of the conductive circuit layer.

In some embodiments, a testing method includes: (a) providing a package structure, wherein the package structure includes a first electronic device, a second electronic device electrically connected to the first electronic device through at least one conductive circuit layer, and at least one test circuit structure disposed adjacent to the at least one conductive circuit layer; and (b) testing the at least one test circuit structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
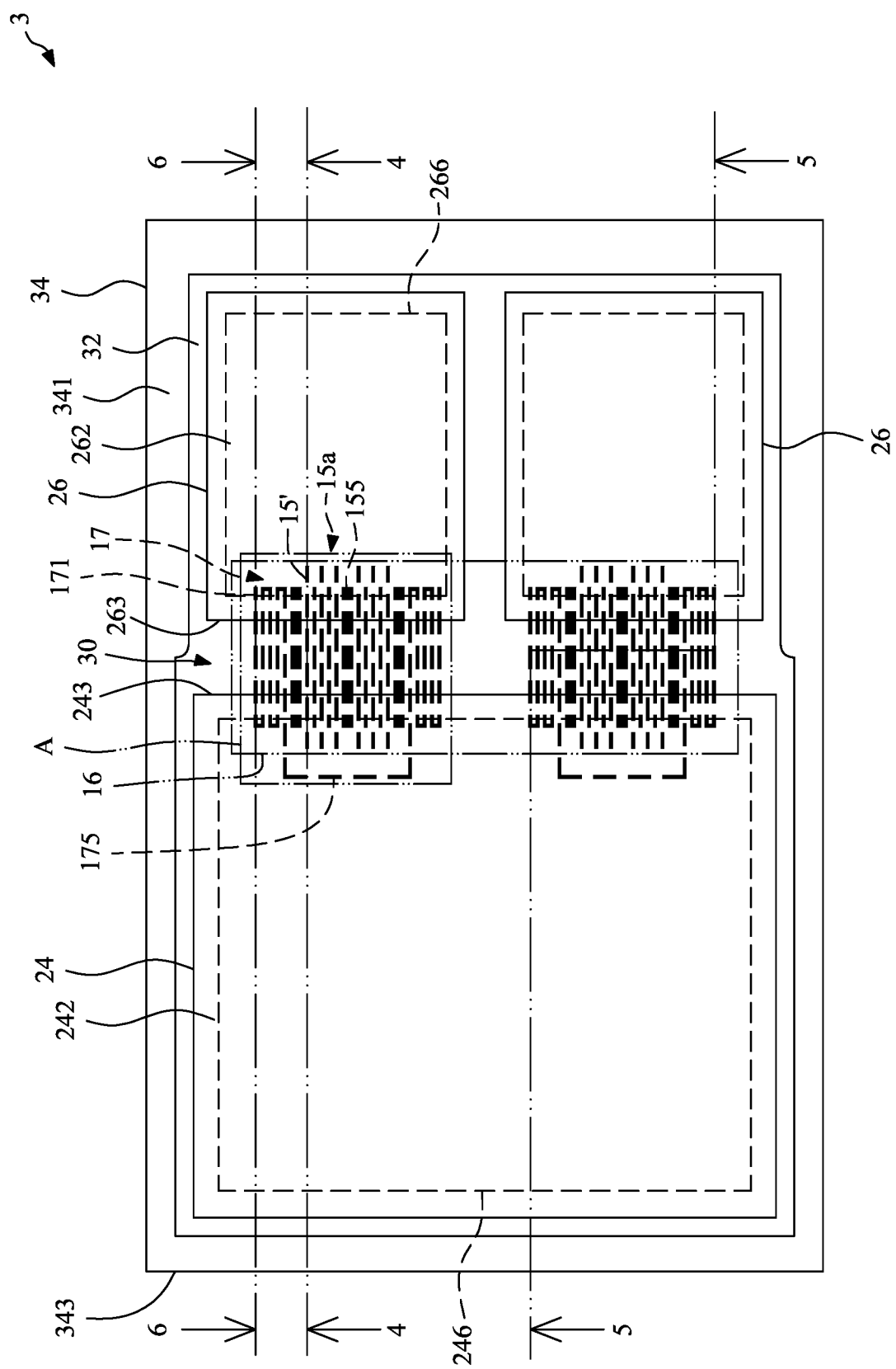
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a wiring structure which includes at least one test circuit structure. In some embodiments, a package structure includes such wiring structure such that a testing may be conducted to the test circuit structure, and the result of such testing may simulate the condition of the conductive circuit layer of the wiring structure. At least some embodiments of the present disclosure further provide for techniques for testing the package structure.

Figure 2:
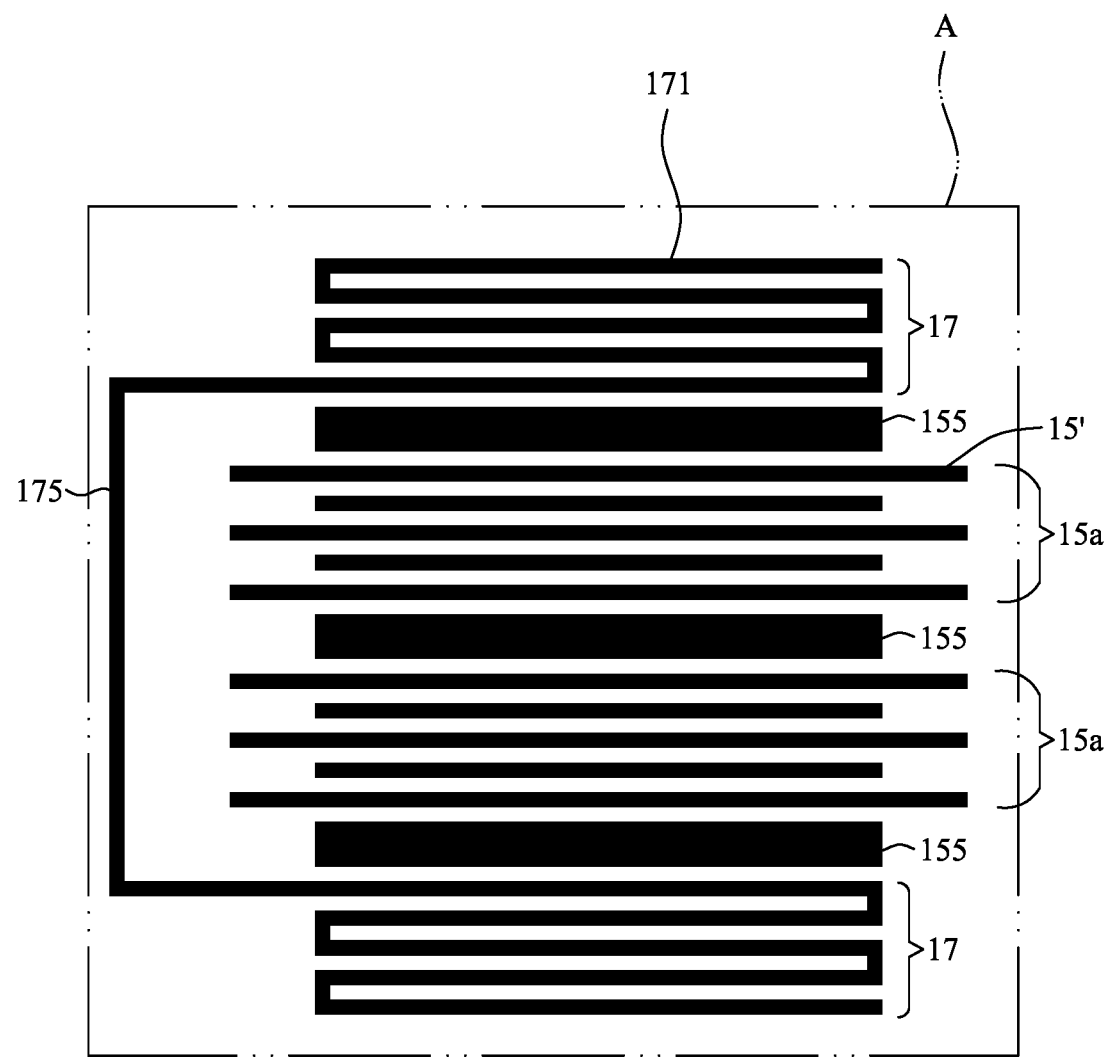
FIG. 2 illustrates an enlarged view of a region "A" in FIG. 1, wherein a first electronic device, a second electronic device, a first protection material and a first dielectric layer are omitted for clear illustration.
Figure 2A:
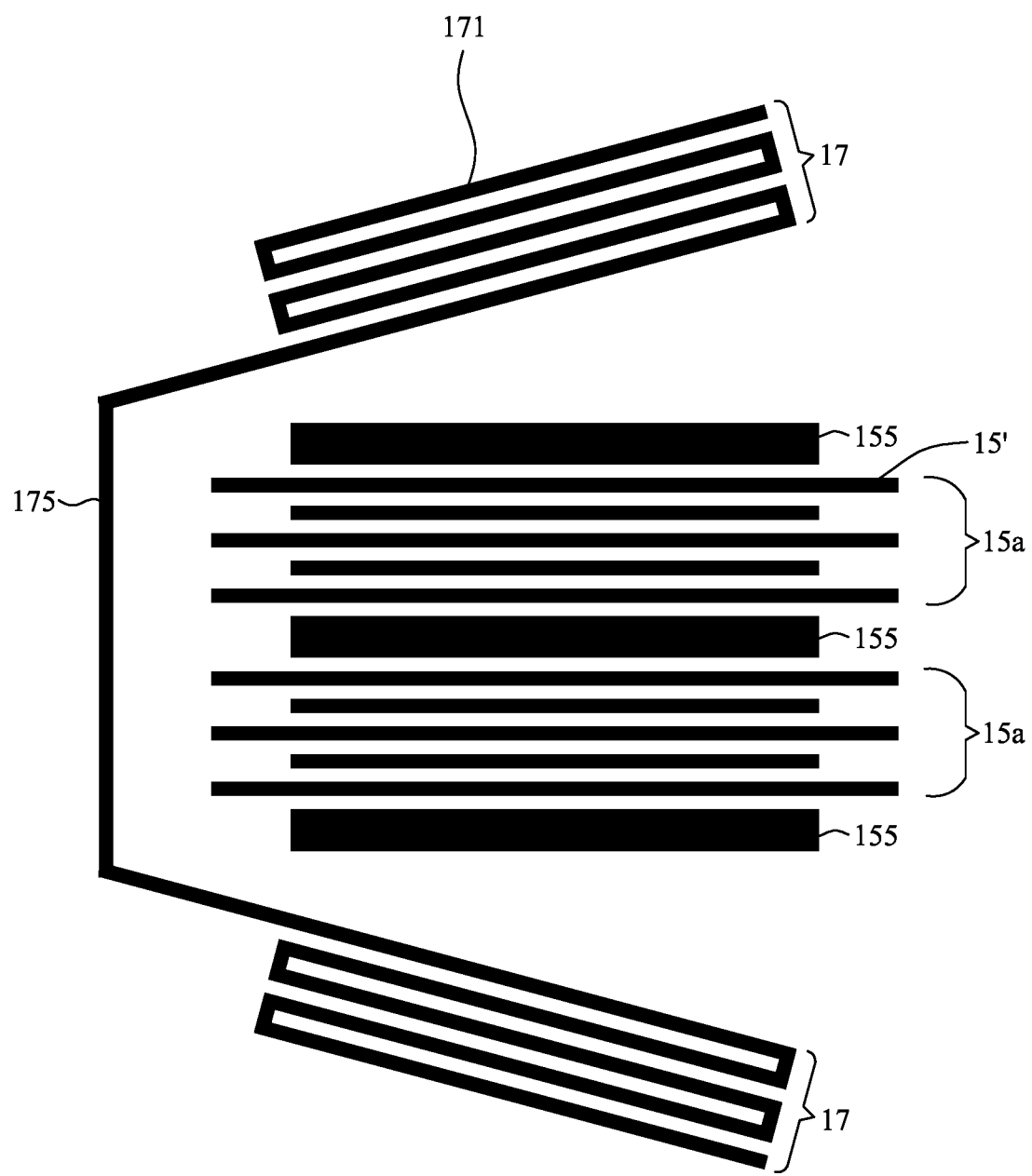
FIG. 2A illustrates a top view of the interconnection portions and the test circuit structures according to some embodiments of the present disclosure.
Figure 3:
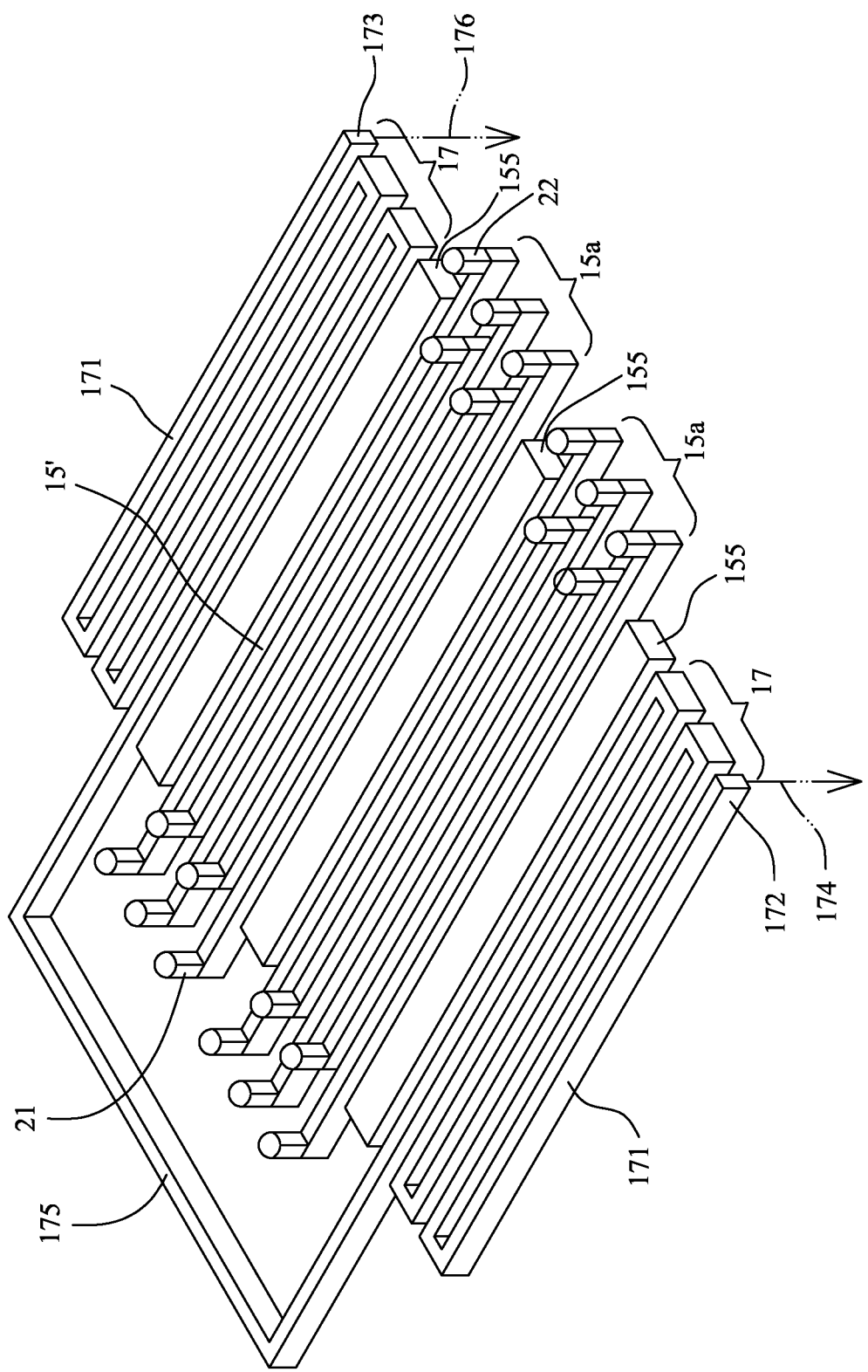
FIG. 3 illustrates a perspective view of FIG. 2.
Figure 4:
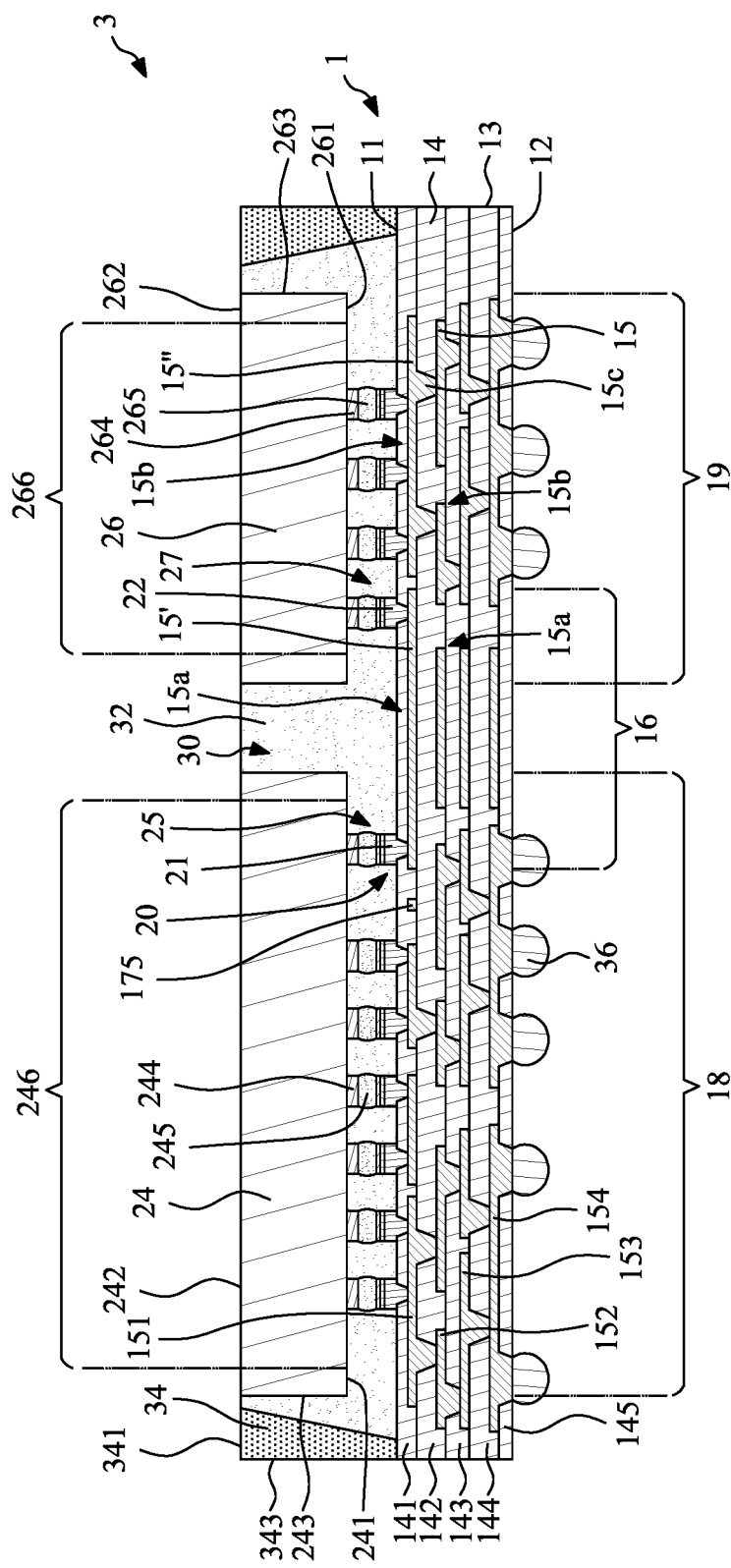
FIG. 4 illustrates a cross-sectional view taken along line 4-4 of the package structure of FIG. 1.
Figure 5:
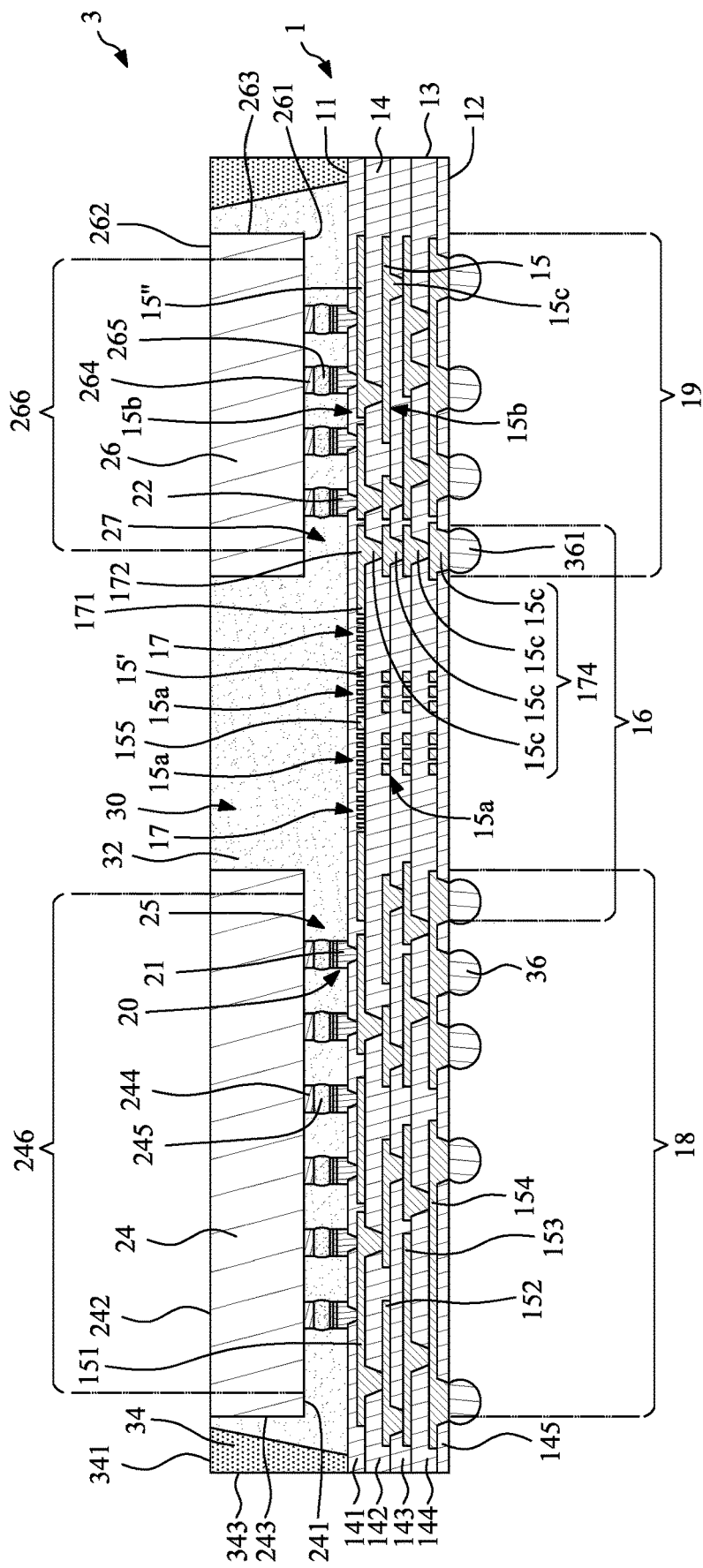
FIG. 5 illustrates a cross-sectional view taken along line 5-5 of the package structure of FIG. 1.

FIG. 1 illustrates a top view of a package structure 3 according to some embodiments of the present disclosure. FIG. 2 illustrates an enlarged view of a region "A" in FIG. 1, wherein a first electronic device 24, a second electronic device 26, a first protection material 32 and a first dielectric layer 141 are omitted for clear illustration. FIG. 2A illustrates a top view of the interconnection portions 15a and the test circuit structures 17 according to some embodiments of the present disclosure. FIG. 3 illustrates a perspective view of FIG. 2. FIG. 4 illustrates a cross-sectional view taken along line 4-4 of the package structure 3 of FIG. 1. FIG. 5 illustrates a cross-sectional view taken along line 5-5 of the package structure 3 of FIG. 1. As shown in FIG. 4 and FIG. 5, the package structure 3 includes a wiring structure 1, a first electronic device 24, a second electronic device 26, a first protection material 32, an encapsulant 34 and a plurality of solder materials 36. As shown in FIG. 1, the package structure 3 may include one first electronic device 24 and two second electronic devices 26. However, the amounts of the first electronic device(s) 24 and the second electronic device(s) 26 are not limited in the present disclosure.

As shown in FIG. 4 and FIG. 5, the wiring structure 1 has a first surface 11 (e.g., a top surface), a second surface 12 (e.g., a bottom surface) opposite to the first surface 11, a lateral surface 13 extending between the first surface 11 and the second surface 12. The wiring structure 1 may include at least one dielectric layer 14, at least one conductive circuit layer 15 in contact with the dielectric layer 14, at least one test circuit layer 17 in contact with the dielectric layer 14, and a plurality of protrusion pads 20. The wiring structure 1 may further include a first chip bonding area 18, a second chip bonding area 19 and a high line density region 16 (or a fine line region) disposed between the first chip bonding area 18 and the second chip bonding area 19. The first electronic device 24 may be attached to the first chip bonding area 18, and the second electronic devices 26 may be attached to the second chip bonding area 19. Thus, the high line density region 16 (or the fine line region) may be disposed between the first electronic device 24 and the second electronic device 26.

For example, as shown in FIG. 4 and FIG. 5, the wiring structure 1 includes a first dielectric layer 141, a first conductive circuit layer 151, a second dielectric layer 142, a second conductive circuit layer 152, a third dielectric layer 143, a third conductive circuit layer 153, a fourth dielectric layer 144, a fourth conductive circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one conductive circuit layer 15 includes the first conductive circuit layer 151, the second conductive circuit layer 152, the third conductive circuit layer 153 and the fourth conductive circuit layer 154.

The first dielectric layer 141 may be a topmost dielectric layer or an outermost dielectric layer of the wiring structure 1. The first conductive circuit layer 151 may be a topmost conductive circuit layer or an outermost conductive circuit layer of the wiring structure 1. A material of the first conductive circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first conductive circuit layer 151 is disposed adjacent to the top surface of the first dielectric layer 141. In some embodiments, the first conductive circuit layer 151 is embedded in the first dielectric layer 141, and is exposed from the top surface of the first dielectric layer 141. That is, the first dielectric layer 141 covers the first conductive circuit layer 151, and defines a plurality of openings to expose portions of the first conductive circuit layer 151.

Further, the first conductive circuit layer 151 may include an interconnection portion 15a and a periphery portion 15b. The first conductive circuit layer 151 may be a topmost conductive circuit layer or an outermost conductive circuit layer of the wiring structure 1. The interconnection portion 15a is located in the high line density region 16, and the periphery portion 15b is located a region outside the high line density region 16 (e.g., a low line density region). For example, the second electronic device 26 may be electrically connected to the first electronic device 24 through the interconnection portion 15a of the first conductive circuit layer 151. The second electronic device 26 and the first electronic device 24 may be electrically connected to the solder materials 36 on the second surface 12 of the wiring structure 1 through the periphery portion 15b of the first conductive circuit layer 151. In some embodiments, the interconnection portion 15a of the first conductive circuit layer 151 may include a plurality of conductive traces 15' parallel with each other, and the periphery portion 15b of the first conductive circuit layer 151 may include a plurality of conductive traces 15''. A line width/line space (L/S) of the conductive traces 15' of the interconnection portion 15a may be less than an L/S of the conductive traces 15'' of the periphery portion 15b. For example, an L/S of the conductive traces 15' of the interconnection portion 15a may be less than or equal to about 5 μm/about 5 μm, or less than or equal to about 2 μm/about 2 μm, or less than or equal to about 0.8 μm/about 0.8 μm. An L/S of the conductive traces 15″ of the periphery portion 15b may be less than or equal to about 10 μm/about 10 μm, or less than or equal to about 7 μm/about 7 μm, or less than or equal to about 5 μm/about 5 μm.

The first dielectric layer 141 and the first conductive circuit layer 151 may be disposed on the second dielectric layer 142. In addition, the second dielectric layer 142 may cover the second conductive circuit layer 152. A portion (i.e., a via portion 15c) of the first conductive circuit layer 151 extends through the second dielectric layer 142 to electrically connect the second conductive circuit layer 152. A material of the second dielectric layer 142 may be the same as or similar to the material of the first dielectric layer 141. The second conductive circuit layer 152 may also include an interconnection portion 15a located in the high line density region 16, and a periphery portion 15b located outside the high line density region 16. In some embodiments, the via portion 15c of the first conductive circuit layer 151 may extend from the periphery portion 15b, and they may be formed concurrently and integrally.

Similarly, the second dielectric layer 142 and the second conductive circuit layer 152 may be disposed on the third dielectric layer 143. In addition, the third dielectric layer 143 may cover the third conductive circuit layer 153. A portion (i.e., a via portion 15c) of the second conductive circuit layer 152 extends through the third dielectric layer 143 to electrically connect the third conductive circuit layer 153. A material of the third dielectric layer 143 may be the same as or similar to the material of the second dielectric layer 142. The third conductive circuit layer 153 may also include an interconnection portion 15a located in the high line density region 16, and a periphery portion 15b located outside the high line density region 16. In some embodiments, the via portion 15c of the second conductive circuit layer 152 may extend from the periphery portion 15b, and they may be formed concurrently and integrally.

Similarly, the third dielectric layer 143 and the third conductive circuit layer 153 may be disposed on the fourth dielectric layer 144. In addition, the fourth dielectric layer 144 may cover the fourth conductive circuit layer 154. A portion (i.e., a via portion 15c) of the third conductive circuit layer 153 extends through the fourth dielectric layer 144 to electrically connect the fourth conductive circuit layer 154. A material of the fourth dielectric layer 144 may be the same as or similar to the material of the third dielectric layer 143. The fourth conductive circuit layer 154 may also include an interconnection portion 15a located in the high line density region 16, and a periphery portion 15b located outside the high line density region 16.

The fourth dielectric layer 144 and the fourth conductive circuit layer 154 may be disposed on the fifth dielectric layer 145. A portion (i.e., a via portion 15c) of the fourth conductive circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 4 and FIG. 5, the second electronic device 26 may be electrically connected to the first electronic device 24 through the interconnection portion 15a of the conductive circuit layer 15 (including, for example, the interconnection portions 15a of the first conductive circuit layer 151, the second conductive circuit layer 152, the third conductive circuit layer 153 and the fourth conductive circuit layer 154). The second electronic device 26 and the first electronic device 24 may be electrically connected to the solder materials 36 through the via portions 15c of the periphery portion 15b of the conductive circuit layer 15 (including, for example, the periphery portions 15b of the first conductive circuit layer 151, the second conductive circuit layer 152, the third conductive circuit layer 153 and the fourth conductive circuit layer 154).

The protrusion pads 20 may be disposed on and protrude from the first dielectric layer 141 (i.e., the topmost dielectric layer or the outermost dielectric layer) of the wiring structure 1. The protrusion pads 20 may be disposed on and protrude from the first surface 11 of the wiring structure 1, and extend through the first dielectric layer 141 (i.e., the topmost dielectric layer or the outermost dielectric layer) to electrically connect the first conductive circuit layer 151. The protrusion pads 20 may include a plurality of first protrusion pads 21 corresponding to the first electronic device 24 and a plurality of second protrusion pads 22 corresponding to the second electronic device 26.

The first electronic device 24 and the second electronic device 26 are disposed adjacent to the first surface 11 of the wiring structure 1 side by side, and are electrically connected to the conductive circuit layer 15 of the wiring structure 1. The first electronic device 24 may be a semiconductor device such as an application specific integrated circuit (ASIC) die. As shown in FIG. 4 and FIG. 5, the first electronic device 24 may have a first active surface 241, a first backside surface 242 opposite to the first active surface 241, and a lateral surface 243 extending between the first active surface 241 and the first backside surface 242. The first electronic device 24 may have a first active area 264 on the first active surface 241. A plurality of electrical circuits and a plurality of electrical components are disposed within the first active area 264. Further, the first electronic device 24 may include a plurality of first electrical contacts 244 disposed adjacent to the first active surface 241. The first electrical contacts 244 may be exposed or may protrude from the first active surface 241 for electrical connection. The first electrical contacts 244 may be pads, bumps, studs, pillars or posts. In some embodiments, the first electrical contacts 244 of the first electronic device 24 may be electrically connected and physically connected to the first protrusion pads 21 through a plurality of solder materials 245. In other words, the first electronic device 24 may be electrically connected to the wiring structure 1 by flip-chip bonding. For example, the first electrical contacts 244 may include copper, gold, platinum, and/or other suitable material.

The second electronic device 26 may be a semiconductor device such as high bandwidth memory (HBM) die. As shown in FIG. 4 and FIG. 5, the second electronic device 26 may have a second active surface 261, a second backside surface 262 opposite to the second active surface 261, and a lateral surface 263 extending between the second active surface 261 and the second backside surface 262. The second electronic device 26 may have a second active area 266 on the second active surface 261. A plurality of electrical circuits and a plurality of electrical components are disposed within the second active area 266. Further, the second electronic device 26 may include a plurality of second electrical contacts 264 disposed adjacent to the second active surface 261. The second electrical contacts 264 may be exposed or may protrude from the second active surface 261 for electrical connection. The second electrical contacts 264 may be pads, bumps, studs, pillars or posts. In some embodiments, the second electrical contacts 264 of the second electronic device 26 may be electrically connected and physically connected to the second protrusion pads 22 through a plurality of solder materials 265. In other words, the second electronic device 26 may be electrically connected to the wiring structure 1 by flip-chip bonding. For example, the second electrical contact 264 may include copper, gold, platinum, and/or other suitable material.

As shown in FIG. 1 to FIG. 3, the test circuit structure 17 may be disposed adjacent to the interconnection portion 15a of the conductive circuit layer 15. In some embodiments, the wiring structure 1 may include a plurality of interconnection portions 15a, a plurality of test circuit structures 17 and a plurality of shielding walls 155. The interconnection portions 15a, the test circuit structures 17 and the shielding walls 155 may be disposed at a same layer and may be formed concurrently. Thus, a material of the test circuit structure 17 and the shielding wall 155 may be same as the material of the interconnection portion 15a, and a thickness of the test circuit structure 17 and a thickness of the shielding wall 155 may be same as a thickness of the interconnection portion 15a. The outermost dielectric layer (i.e., the first dielectric layer 141) may cover the outermost conductive circuit layer (i.e., the first conductive circuit layer 151) and the test circuit structure 17. In some embodiments, the first conductive circuit layer 151, the test circuit structures 17 and the shielding walls 155 may constitute a first metal layer (i.e., a topmost metal layer) of the wiring structure 1. Further, the wiring structure 1 may further include a second metal layer including the second conductive circuit layer 152, a third metal layer including the third conductive circuit layer 153 and a fourth metal layer including the fourth conductive circuit layer 154. In some embodiments, the first metal layer and the third metal layer may be signal transmission layers, and the third metal layer and the fourth metal layer may be power/ground layers.

In addition, the interconnection portions 15a are disposed next to each other. The test circuit structures 17 are disposed on two sides of the interconnection portions 15a. Some of the shielding walls 155 may be disposed between the interconnection portions 15a so as to prevent the crosstalk between the interconnection portions 15a. Some of the shielding walls 155 may be disposed between the interconnection portion 15a and the test circuit structures 17 so as to prevent the crosstalk between the interconnection portion 15a and the test circuit structures 17. It is noted that the shielding walls 155 may be or may be not electrically connected to a grounding layer. The test circuit structures 17 and the shielding walls 155 may be located in the high line density region 16. Thus, the interconnection portions 15a, the test circuit structures 17 and the shielding walls 155 are disposed under a gap 30 between the lateral surface 243 of the first electronic device 24 and the lateral surface 263 of the second electronic device 26. That is, two ends of the interconnection portion 15a extend to the first chip bonding area 18 and the second chip bonding area 19 respectively. A first portion of the interconnection portion 15a is disposed within a vertical projection of the first active area 246 of the first electronic device 24, and a second portion of the interconnection portion 15a is disposed within a vertical projection of the second active area 266 of the second electronic device 26. Further, two ends of the test circuit structures 17 extend to the first chip bonding area 18 and the second chip bonding area 19 respectively. Two ends of the shielding wall 155 extend to the first chip bonding area 18 and the second chip bonding area 19 respectively. A first portion of the test circuit structure 17 is disposed within a vertical projection of the first active area 246 of the first electronic device 24, and a second portion of the test circuit structure 17 is disposed within a vertical projection of the second active area 266 of the second electronic device 26. That is, the first portion of the test circuit structure 17 extends to a space under the first electronic device 24, and the second portion of the test circuit structure 17 extends to a space under the second electronic device 26.

In some embodiments, the test circuit structures 17 may be dummy, and may be not electrically connected to the interconnection portions 15a of the conductive circuit layer 15. That is, the test circuit structures 17 may be electrically isolated from the interconnection portions 15a of the conductive circuit layer 15. Further, the test circuit structures may be electrically isolated from the first electronic device 24 and the second electronic device 26. For example, the interconnection portion 15a of the conductive circuit layer 15 may be used to transmitting signals (e.g., digital signals) between the first electronic device 24 and the second electronic device 26, whereas the test circuit structure 17 does not have the function of transmitting signals (e.g., digital signals). Thus, the test circuit structure 17 may be electrically isolated from a digital signal transmission path of the package structure 3.

As shown in FIG. 2, a pattern (or a layout) of the test circuit structure 17 may be similar to or same as a pattern (or a layout) of the interconnection portion 15a of the conductive circuit layer 15. For example, the test circuit structure 17 may include a plurality of segments 171 parallel with each other. A line width/line space (L/S) of the segments 171 of the test circuit structure 17 may substantially equal to the line width/line space (L/S) of the conductive traces 15' of the interconnection portion 15a. Further, the conductive traces 15' of the interconnection portion 15a and the shielding walls 155 may be substantially parallel with the segments 171 of the test circuit structure 17. In addition, a width of the shielding wall 155 may be greater than a width of a conductive trace 15' of the interconnection portion 15a by, for example, two times, three times, four time, or five times or greater.

In some embodiments, a gap between the interconnection portion 15a of the conductive circuit layer 15 and the shielding wall 155 may be substantially equal to a line space of the conductive traces 15' of the interconnection portion 15a. A gap between the test circuit structure 17 and the shielding wall 155 may be substantially equal to a line space of the conductive traces 15' of the interconnection portion 15a. If the shielding walls 155 are omitted, a gap between the test circuit structure 17 and the interconnection portion 15a may be substantially equal to a line space of the conductive traces 15' of the interconnection portion 15a.

As shown in FIG. 2A, an inclination angle may be formed between the conductive traces 15' of the interconnection portion 15a and the segments 171 of the test circuit structure 17. Such inclination angle may be less than 90 degrees, 60 degrees, 45 degrees, 30 degrees, or 15 degrees. Thus, the conductive traces 15' of the interconnection portion 15a are not perpendicular to the segments 171 of the test circuit structure 17.

As shown in FIG. 2 and FIG. 3, the segments 171 of each of the test circuit structures 17 are connected in series with each other. In some embodiments, each of the test circuit structures 17 may be in a serpentine shape. Further, the test circuit structures 17 may be electrically connected with each other through a connection portion 175. The connection portion 175 may be located in the high line density region 16 or outside the high line density region 16. In addition, the connection portion 175 and the test circuit structures 17 may be disposed at the same layer or at different layers. In some embodiments, the connection portion 175 may be disposed right above or right under the interconnection portion 15a.

Figure 6:
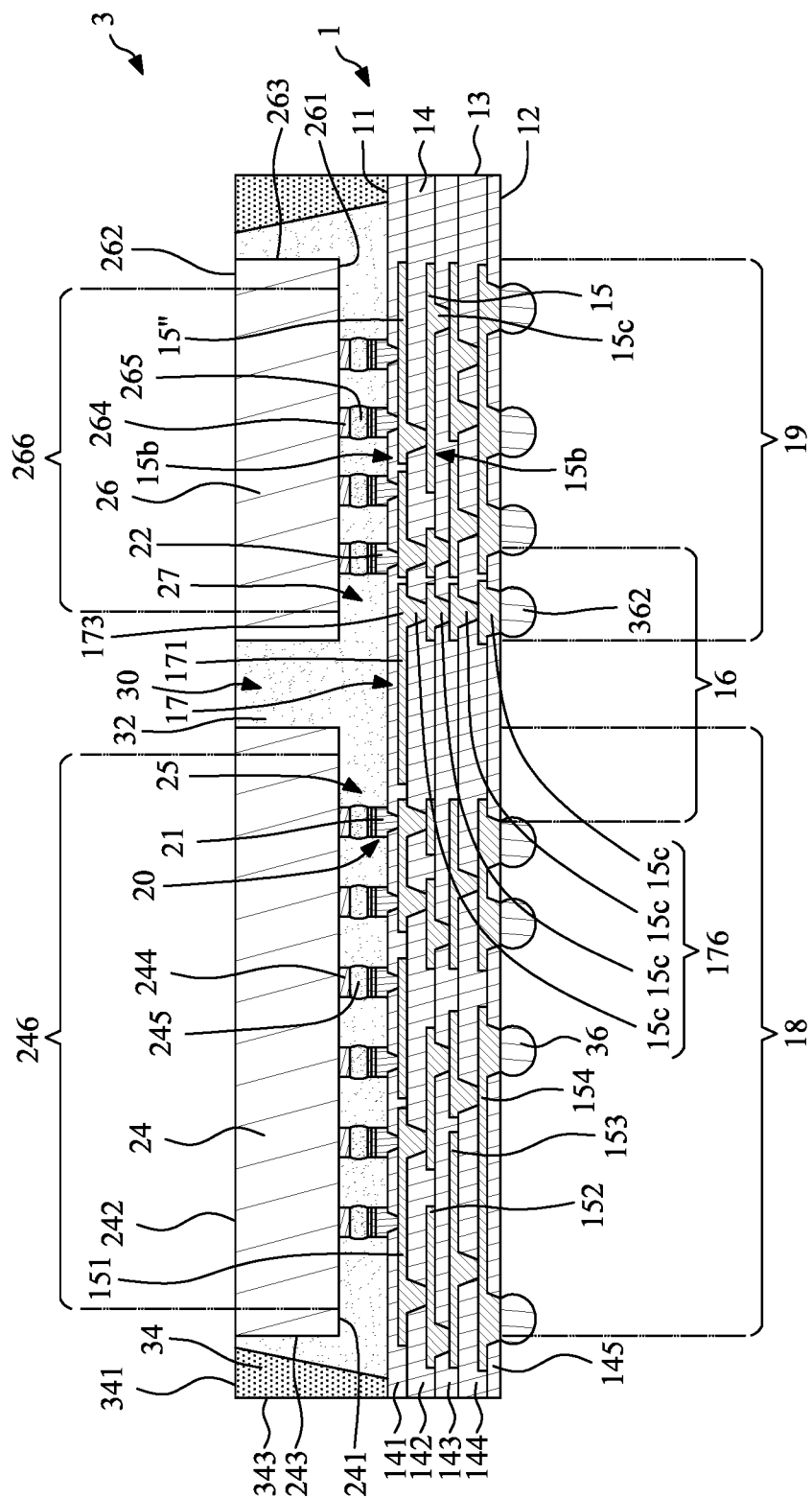
FIG. 6 illustrates a cross-sectional view taken along line 6-6 of the package structure of FIG. 1.

As shown in FIG. 3 and FIG. 5, one end of the test circuit structure 17 may be electrically connected to the second surface 12 of the wiring structure 1. For example, an outermost segment 171 of one of the test circuit structures 17 may have an electrical connection end 172 that is electrically connected downward to the second surface 12 of the wiring structure 1 through a downward electrical path 174. The downward electrical path 174 may include the via portion 15c of the first conductive circuit layer 151, the via portion 15c of the second conductive circuit layer 152, the via portion 15c of the third conductive circuit layer 153 and the via portion 15c of the fourth conductive circuit layer 154. It is noted that the exposed via portion 15c of the fourth conductive circuit layer 154 may be an electrical contact for a probe 91 (FIG. 18) to contact. The test circuit structure 17 is electrically connected to the electrical contact. For example, an outermost segment 171 of another one of the test circuit structures 17 may have an electrical connection end 173 that is electrically connected downward to the second surface 12 of the wiring structure 1 through a downward electrical path 176 (FIG. 6). The downward electrical path 176 may include the via portions 15c of the first conductive circuit layer 151, the second conductive circuit layer 152, the third conductive circuit layer 153 and the fourth conductive circuit layer 154. It is noted that the exposed via portion 15c of the fourth conductive circuit layer 154 may be an electrical contact for a probe to contact. The test circuit structure 17 is electrically connected to the electrical contact. Thus, the test circuit structures 17 are not electrically connected upward to the first electronic device 24 and the second electronic device 26. There is no protrusion pad 20 on the test circuit structures 17. The test circuit structure 17 may be free of upward electrical connection. In some embodiments, the downward electrical paths 174, 176 are independent electrical paths in the wiring structure 1.

As shown in FIG. 4 and FIG. 5, the first protection material 32 (i.e., an underfill) is disposed in the first space 25 between the first electronic device 24 and the wiring structure 1 and in the second space 27 between the second electronic device 26 and the wiring structure 1 so as to cover and protect the joints formed by the first electrical contacts 244, the first protrusion pads 21 and the solder materials 245, and the joints formed by the second electrical contacts 264, the second protrusion pads 22 and the solder materials 265. In addition, the first protection material 32 may further extend into a gap 30 between the lateral surface 243 of the first electronic device 24 and the lateral surface 263 of the second electronic device 26.

The encapsulant 34 (i.e., a second protection material) covers at least a portion of the first surface 11 of the wiring structure 1, at least a portion of the first electronic device 24, at least a portion of the second electronic device 26 and the first protection material 32. A material of the encapsulant 34 may be a molding compound with or without fillers. The encapsulant 34 has a first surface 341 (e.g., a top surface) and a lateral surface 343. In some embodiments, the first surface 341 of the encapsulant 34, the first backside surface 242 of the first electronic device 24, the second backside surface 262 of the second electronic device 26 and a top surface of the first protection material 32 in the gap 30 may be substantially coplanar with each other. However, in other embodiments, the top surface of the first protection material 32 in the gap 30 may be recessed from the first backside surface 242 of the first electronic device 24 and/or the second backside surface 262 of the second electronic device 26. Thus, a portion of the encapsulant 34 may extend into the gap 30 between the first electronic device 24 and the second electronic device 26. In addition, the lateral surface 343 of the encapsulant 34 may be substantially coplanar with the lateral surface 13 of the wiring structure 1.

The solder materials 36 (e.g., solder balls) are disposed adjacent to the second surface 12 of the wiring structure 1 for external connection. As shown in FIG. 4 and FIG. 5, the solder materials 36 are disposed on the exposed portions (i.e., the bottom portions of the via portions 15c) of the fourth conductive circuit layer 154. In some embodiments, the solder materials 36 may include a test solder material 361. The test solder material 361 is electrically connected to the downward electrical path 174. Thus, the test solder material 361 is electrically connected to the electrical connection end 172 of the outermost segment 171 of the test circuit structure 17 through the via portion 15c of the first conductive circuit layer 151, the via portion 15c of the second conductive circuit layer 152, the via portion 15c of the third conductive circuit layer 153 and the via portion 15c of the fourth conductive circuit layer 154.

FIG. 6 illustrates a cross-sectional view taken along line 6-6 of the package structure 3 of FIG. 1. An outermost segment 171 of one of the test circuit structures 17 may have an electrical connection end 173 that is electrically connected downward to the second surface 12 of the wiring structure 1 through a downward electrical path 176 (FIG. 3). The downward electrical path 176 may include the via portion 15c of the first conductive circuit layer 151, the via portion of the second conductive circuit layer 152, the via portion 15c of the third conductive circuit layer 153 and the via portion 15c of the fourth conductive circuit layer 154. In some embodiments, the solder materials 36 may include a test solder material 362. The test solder material 362 is electrically connected to the downward electrical path 176. Thus, the test solder material 362 is electrically connected to the electrical connection end 173 of the outermost segment 171 of the test circuit structure 17 through the via portion 15c of the first conductive circuit layer 151, the via portion 15c of the second conductive circuit layer 152, the via portion of the third conductive circuit layer 153 and the via portion 15c of the fourth conductive circuit layer 154.

In the embodiment illustrated in FIG. 1 to FIG. 6, the pattern (or a layout) of the test circuit structure 17 may be similar to or same as the pattern (or a layout) of the interconnection portion 15a of the conductive circuit layer 15. Thus, the test circuit structure(s) 17 may simulate the condition of the interconnection portion(s) 15a of the conductive circuit layer 15. That is, if the segment(s) 171 of the test circuit structure(s) 17 is cracked or broken, and an open circuit occurs in the test circuit structure(s) 17, the interconnection portion(s) 15a of the conductive circuit layer 15 may be assumed to be cracked or broken. In the package structure 3, if a crack is formed at the top surface of the first protection material 32 in the gap 30 and extend or grow downward to crack or break the interconnection portion(s) 15a of the conductive circuit layer 15, suck crack may crack or break the test circuit structure(s) 17 simultaneously. Therefore, in a testing stage, a test may be conducted to the test circuit structure(s) 17 from the second surface 12 (e.g., the bottom surface) of the wiring structure 1 through the downward electrical paths 174, 176 to presume whether or not the interconnection portion(s) 15a of the conductive circuit layer is cracked or broken. Such a test loop is only disposed in the wiring structure 1, and will not pass through the first electronic device 24 and the second electronic device 26. Thus, the first electronic device 24 and the second electronic device 26 need not to add any circuit to test the interconnection portion(s) 15a of the conductive circuit layer 15.

Figure 7:
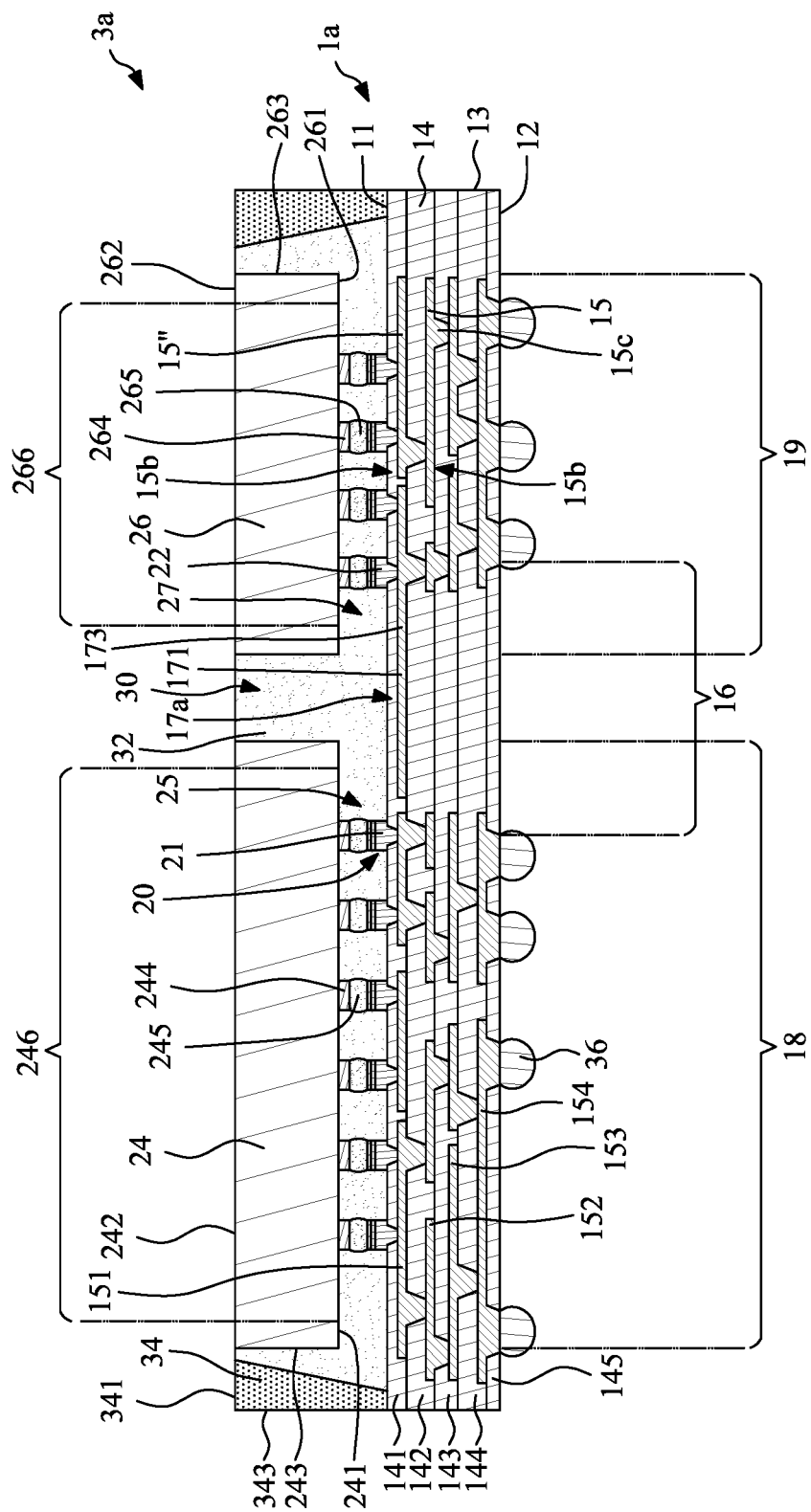
FIG. 7 illustrates a cross-sectional view of a package structure according to some embodiments of the present disclosure.

FIG. 7 illustrates a cross-sectional view of a package structure 3a according to some embodiments of the present disclosure. The package structure 3a of FIG. 7 is similar to the package structure 3 of FIG. 1 to FIG. 6, except for a structure of the test circuit structure(s) 17a of the wiring structure 1a. The electrical connection end 173 of the outermost segment 171 of one of the test circuit structures 17 is electrically connected to a power/ground path of the wiring structure 1a. Thus, the test solder material 362 of FIG. 6 may be omitted. In some embodiments, the electrical connection end 173 of the outermost segment 171 of one of the test circuit structures 17 may be electrically connected to the conductive circuit layer 15. Thus, the test circuit structures 17 may receive test signals from the conductive circuit layer 15.

Figure 8:
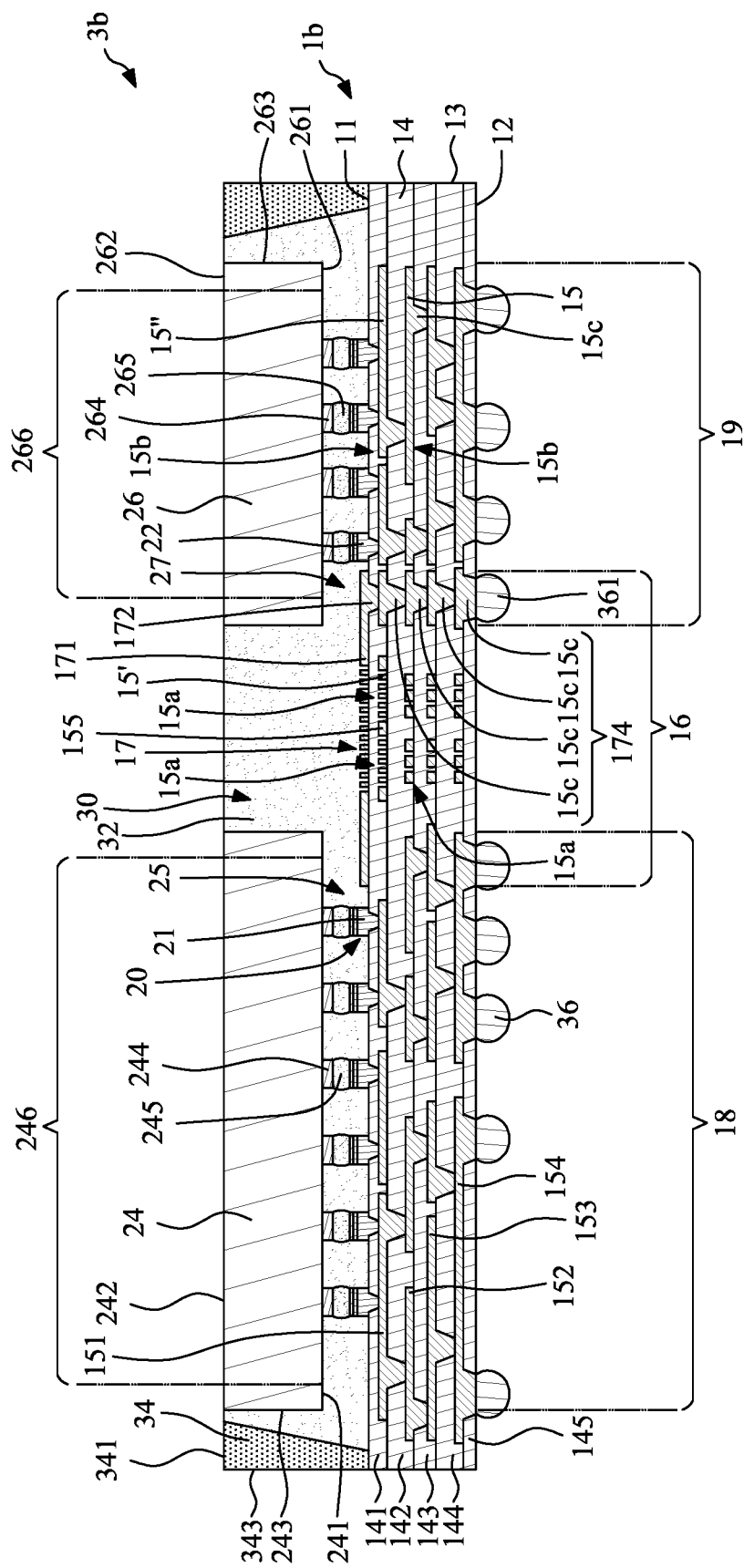
FIG. 8 illustrates a cross-sectional view of a package structure according to some embodiments of the present disclosure.

FIG. 8 illustrates a cross-sectional view of a package structure 3b according to some embodiments of the present disclosure. The package structure 3b of FIG. 8 is similar to the package structure 3 of FIG. 1 to FIG. 6, except for a position of the test circuit structure(s) 17 of the wiring structure 1b. The test circuit structure(s) 17 may be disposed above the interconnection portion(s) 15a of the conductive circuit layer 15. As shown in FIG. 8, the test circuit structure(s) 17 may be disposed on the top surface of the first dielectric layer 141 (e.g., the first surface 11 of the wiring structure 1a) and right above the interconnection portion(s) 15a of the first conductive circuit layer 151. Thus, the outermost dielectric layer (i.e., the first dielectric layer 141) may cover the outermost conductive circuit layer (i.e., the first conductive circuit layer 151), and the test circuit structure(s) 17 may be disposed on the outermost dielectric layer (i.e., the first dielectric layer 141). In some embodiments, from a top view, a total area of the test circuit structure(s) 17 may be greater than a total area of the interconnection portion(s) of the first conductive circuit layer 151, thus, the downward electrical paths 174, 176 may not contact the interconnection portion(s) 15a of the first conductive circuit layer 151. In some embodiments, the test circuit structure(s) 17 may be disposed under the interconnection portion(s) of the conductive circuit layer 15.

Figure 9:
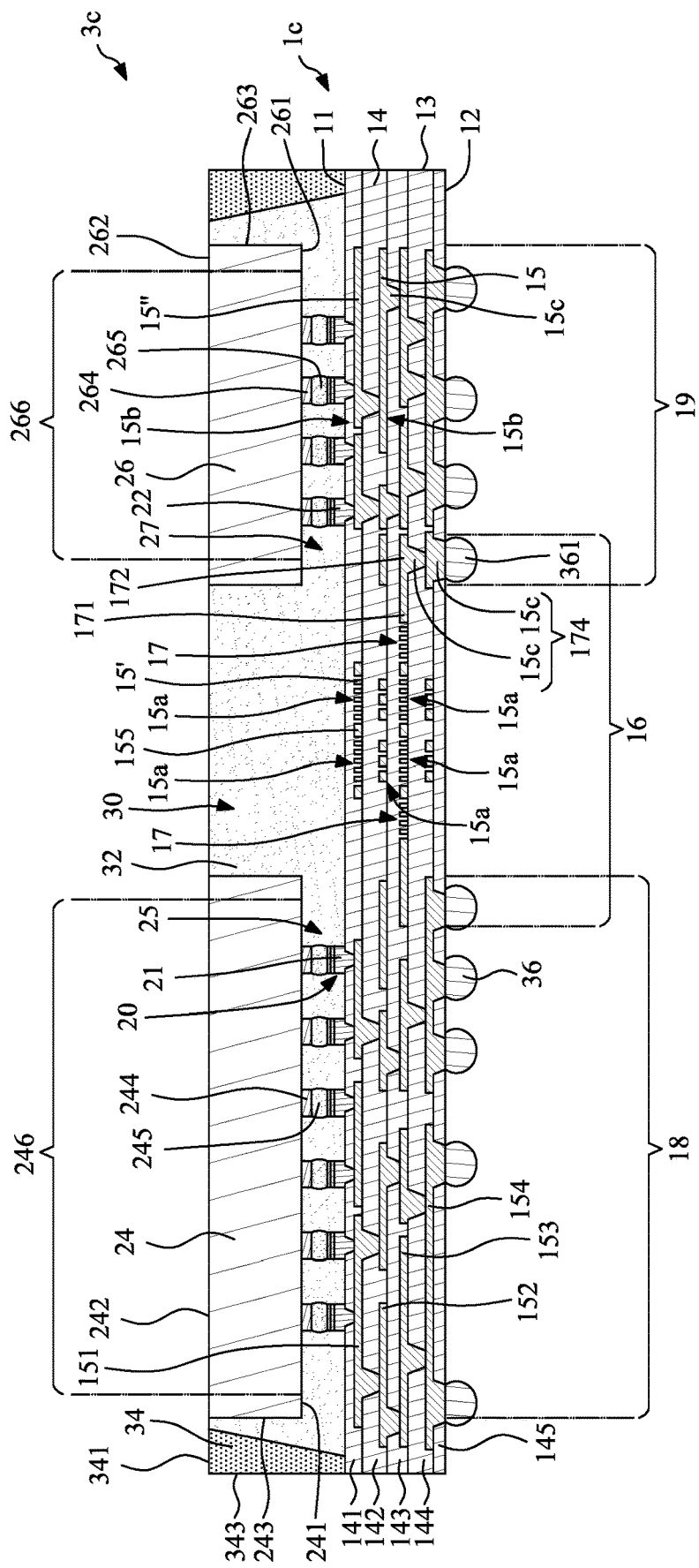
FIG. 9 illustrates a cross-sectional view of a package structure according to some embodiments of the present disclosure.

FIG. 9 illustrates a cross-sectional view of a package structure 3c according to some embodiments of the present disclosure. The package structure 3c of FIG. 9 is similar to the package structure 3 of FIG. 1 to FIG. 6, except for a position of the test circuit structure(s) 17 of the wiring structure 1c. The interconnection portions 15a of the third conductive circuit layer 153, the test circuit structure(s) 17 and the shielding walls 155 may be disposed at a same layer and may be formed concurrently. Thus, the test circuit structure(s) 17 may be disposed under the first conductive circuit layer 151. There may be no test circuit structure(s) 17 in the first metal layer of the wiring structure 1c. The first metal layer of the wiring structure 1c may include only the first conductive circuit layer 151.

Figure 10:
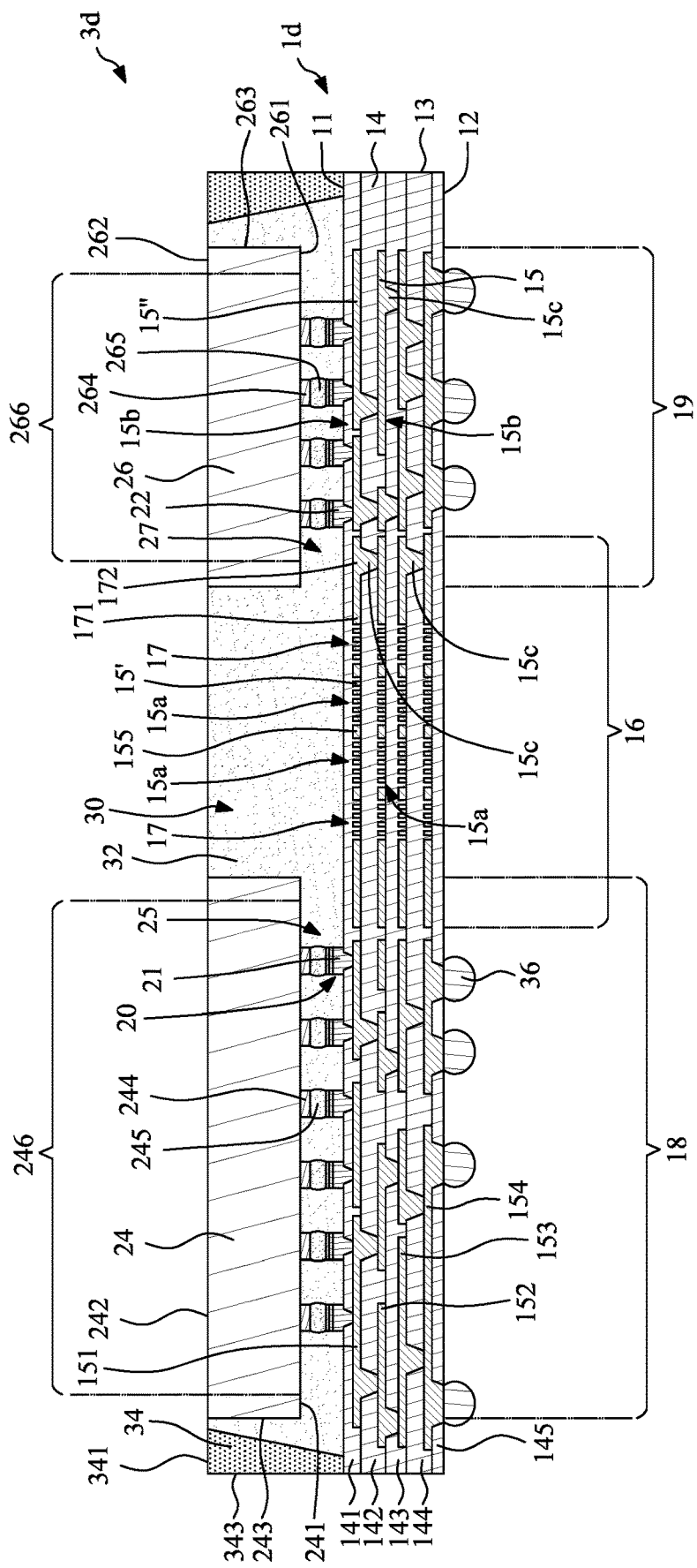
FIG. 10 illustrates a cross-sectional view of a package structure according to some embodiments of the present disclosure.

FIG. 10 illustrates a cross-sectional view of a package structure 3d according to some embodiments of the present disclosure. The package structure 3d of FIG. 10 is similar to the package structure 3 of FIG. 1 to FIG. 6, except for an amount and a position of the test circuit structures 17 of the wiring structure 1d. Each of the metal layers of the wiring structure 1d may include the test circuit structures 17. That is, the second metal layer may further include the test circuit structures 17 disposed adjacent to the interconnection portions 15a of the second conductive circuit layer 152, the third metal layer may further include the test circuit structures 17 disposed adjacent to the interconnection portions 15a of the third conductive circuit layer 153, and the fourth metal layer may further include the test circuit structures 17 disposed adjacent to the interconnection portions 15a of the fourth conductive circuit layer 154. In some embodiments, the test circuit structures 17 disposed at different metal layers are electrically connected in series with each other.

Figure 11:
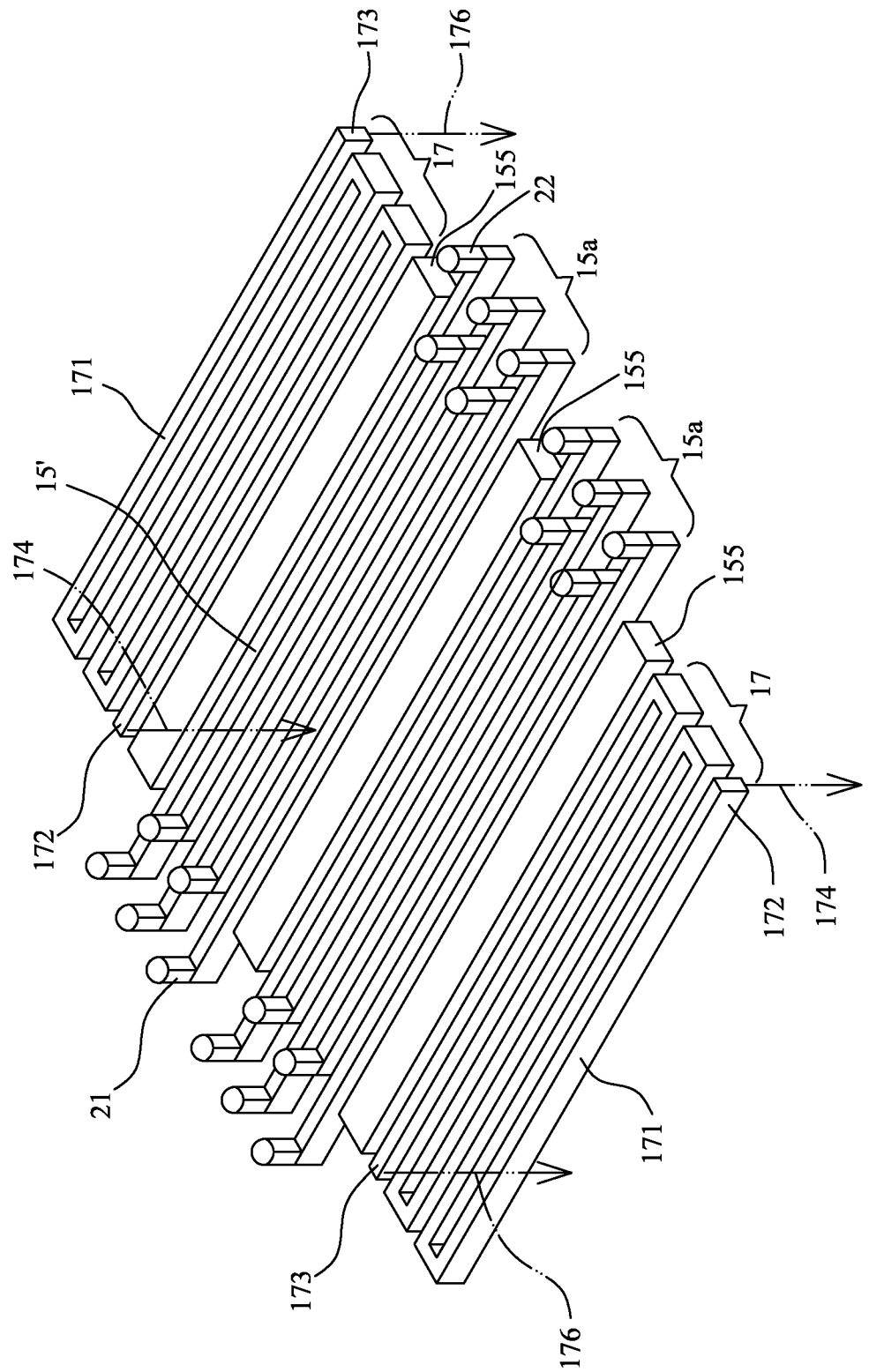
FIG. 11 illustrates a perspective view of the test circuit structures and the interconnection portions according to some embodiments of the present disclosure.

FIG. 11 illustrates a perspective view of the test circuit structures 17 and the interconnection portions 15a according to some embodiments of the present disclosure. The test circuit structures 17 of FIG. 11 are similar to the test circuit structures 17 of FIG. 3, except that the test circuit structures 17 are not electrically connected to each other. That is, the connection portion 175 is omitted. In addition, each of the test circuit structures 17 may include an electrical connection end 172 that is electrically connected to the downward electrical path 174, and an electrical connection end 173 that is electrically connected to the downward electrical path 176.

Figure 12:
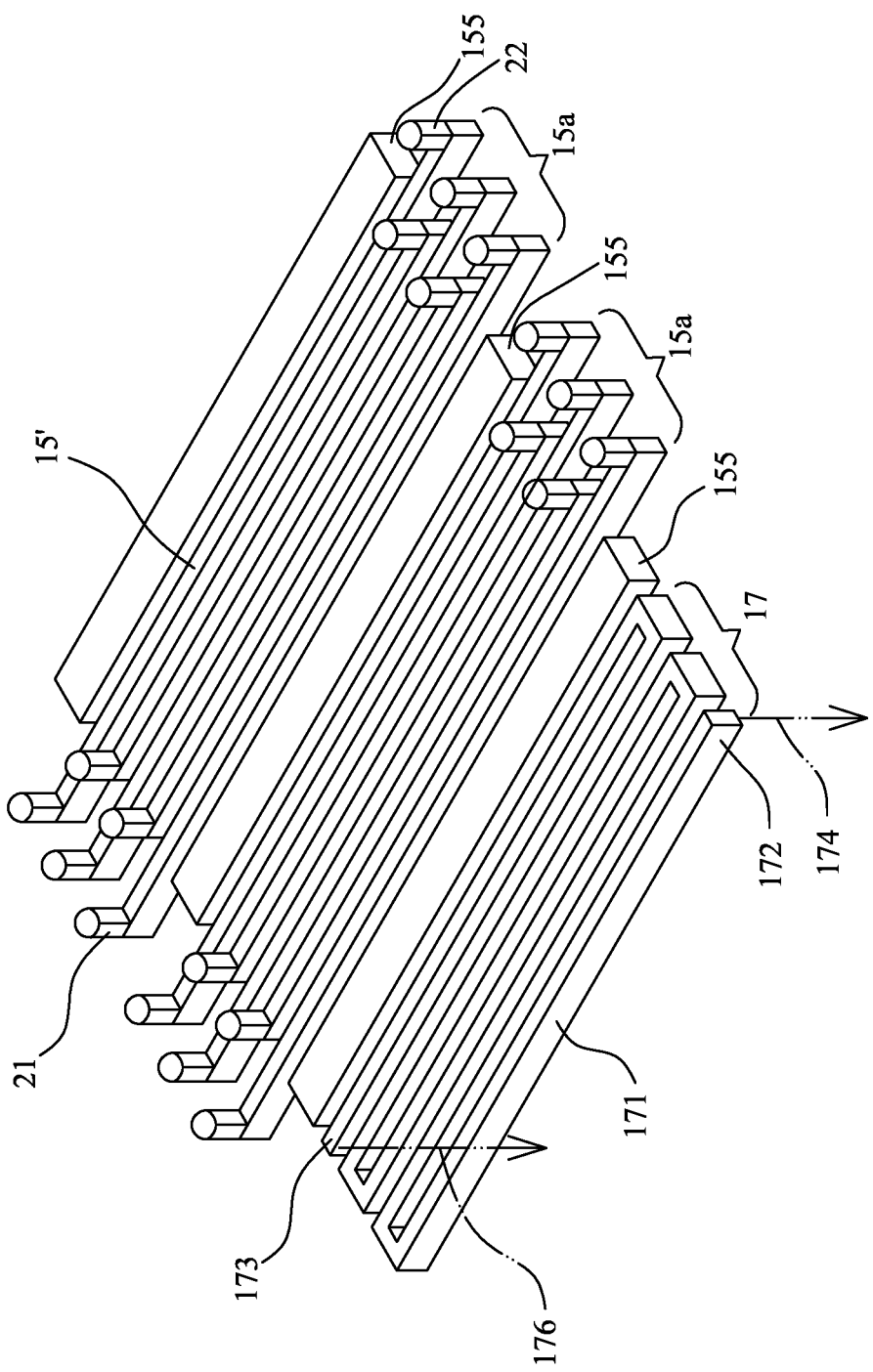
FIG. 12 illustrates a perspective view of the test circuit structure and the interconnection portions according to some embodiments of the present disclosure.

FIG. 12 illustrates a perspective view of the test circuit structure 17 and the interconnection portions 15a according to some embodiments of the present disclosure. The test circuit structure 17 of FIG. 12 is similar to the test circuit structures 17 of FIG. 11, except for the amount of the test circuit structure(s) 17. As shown in FIG. 12, there is only one test circuit structures 17 disposed on one side of the interconnection portions 15a.

Figure 13:
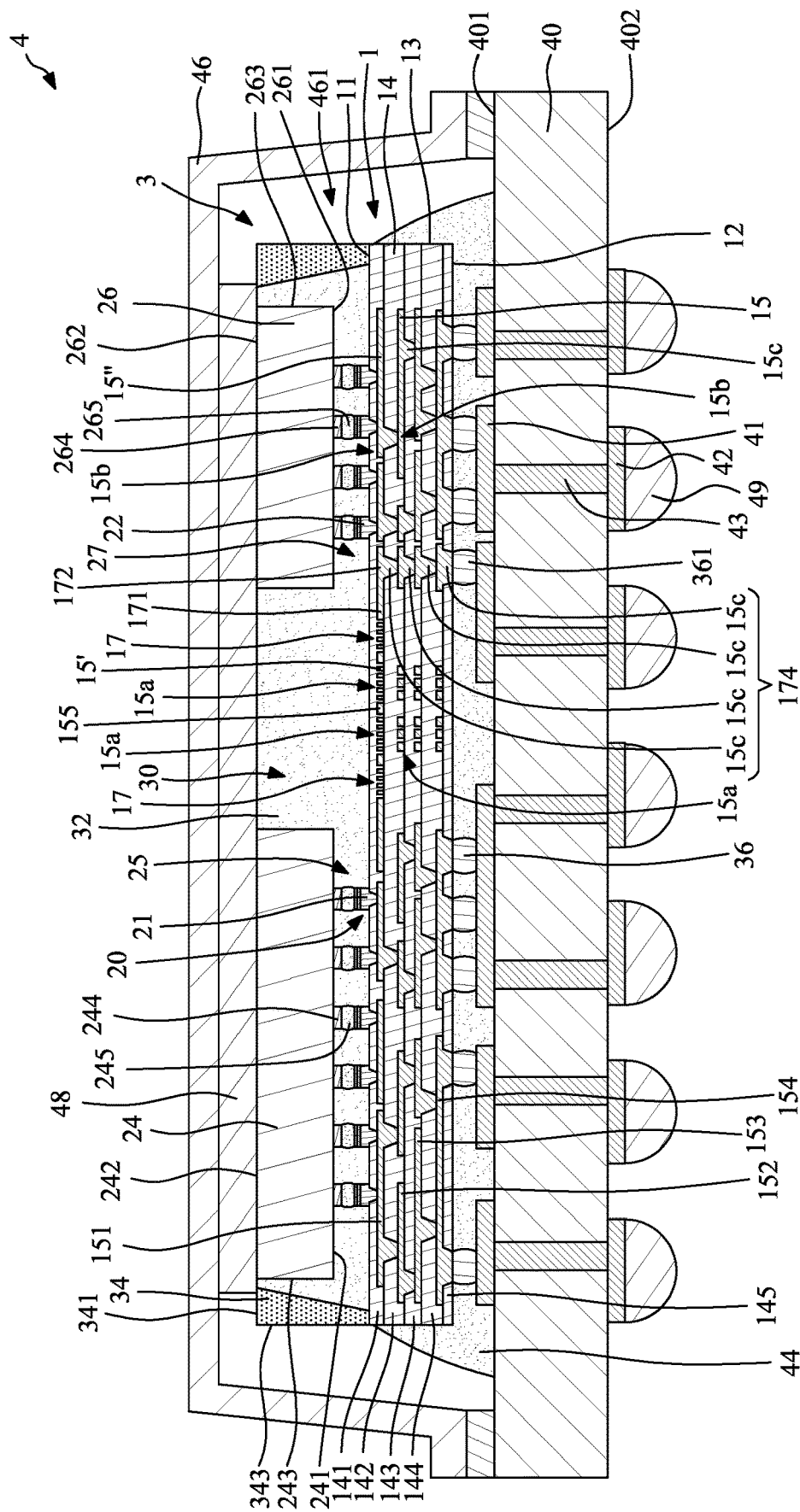
FIG. 13 illustrates a cross-sectional view of an assembly structure according to some embodiments of the present disclosure.

FIG. 13 illustrates a cross-sectional view of an assembly structure 4 according to some embodiments of the present disclosure. The assembly structure 4 may be also a package structure, and may include a base substrate 40, a package structure 3, a third protection material 44, a heat sink 46 and a plurality of external connectors 49.

The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 13, the base substrate 40 may include a first patterned circuit 41, a second patterned circuit 42, and a plurality of conductive vias 43. The first patterned circuit 41 may be disposed adjacent to the first surface 401 of the base substrate 40, and the second patterned circuit 42 may be disposed adjacent to the second surface 402 of the base substrate 40. The conductive vias 43 may extend through the base substrate 40 and electrically connect the first patterned circuit 41 and the second patterned circuit 42.

The package structure 3 of FIG. 13 may be same as or similar to the package structure 3 of FIG. 1 to FIG. 6. The package structure 3 may be electrically connected to the first patterned circuit 41 of the base substrate 40 through the solder materials 36. The third protection material 44 (i.e., an underfill) is disposed in a space between the package structure 3 and the base substrate 40 so as to cover and protect the solder materials 36 and the first patterned circuit 41.

The heat sink 46 may be a cap or hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic device 26. Another portion (e.g., bottom portion) of the heat sink 46 may be attached to the base substrate 40 through an adhesive material. In addition, the external connectors 49 (e.g., solder balls) are formed or disposed on the second patterned circuit 42 for external connection. It is noted that the package structure 3 may be replaced by the package structures 3a, 3b, 3c, 3d of FIGS. 7, 8, 9, 10.

During a testing process, the test circuit structure(s) 17 may be tested from the second surface 402 of the base substrate 40.

FIG. 14 through FIG. 21 illustrate a testing method according to some embodiments of the present disclosure. In some embodiments, the method may be also used for manufacturing the package structure 3 shown in FIG. 1 to FIG. 6, and the assembly structure 4 of FIG. 13.

Figure 14:
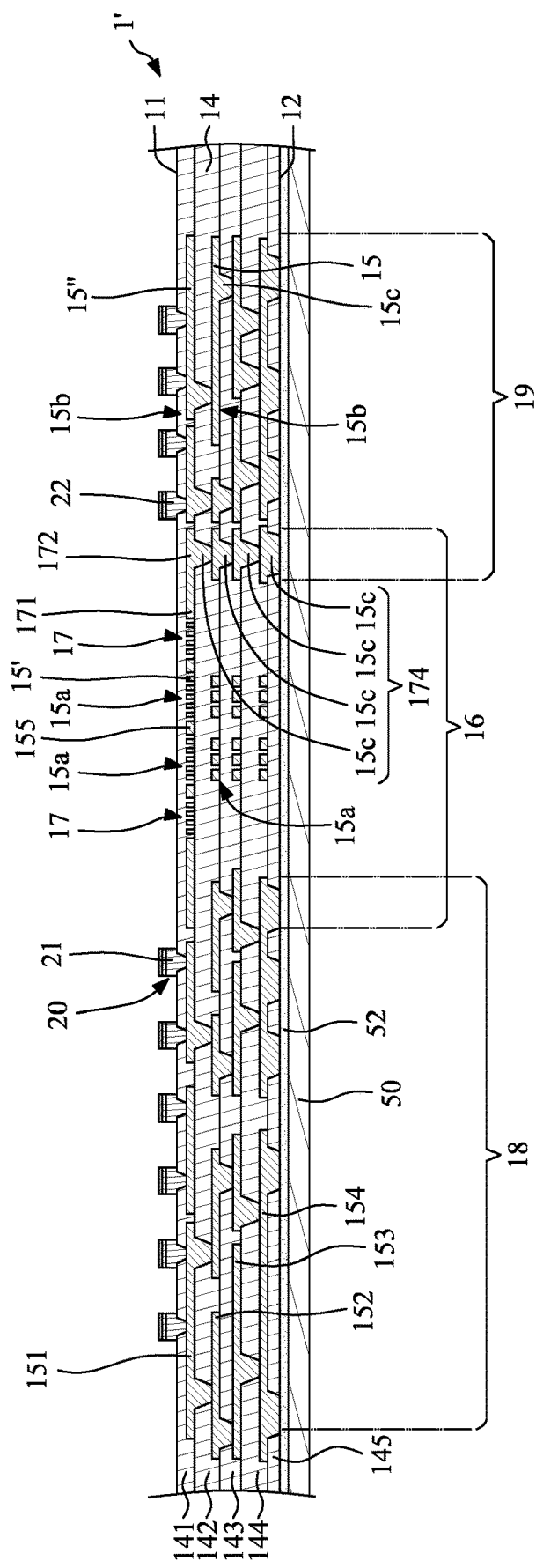
FIG. 14 illustrates one or more stages of an example of a testing method according to some embodiments of the present disclosure.

Referring to FIG. 14, a carrier 50 is provided. The carrier 50 may be in a wafer type or strip type. The carrier 50 may include a release layer 52 disposed thereon. Then, a wiring structure 1' is formed or disposed on the release layer 52 on the carrier 50. The wiring structure 1' of FIG. 14 may be similar to the wiring structure 1 of FIG. 5, and may have a first surface 11, a second surface 12 opposite to the first surface 11, a high line density region 16 (or a fine line region), a first chip bonding area 18 and a second chip bonding area 19. The wiring structure 1' may include at least one dielectric layer 14, at least one conductive circuit layer 15 in contact with the dielectric layer 14, at least one test circuit layer 17 in contact with the dielectric layer 14, and a plurality of protrusion pads 20. For example, as shown in FIG. 14, the wiring structure 1' includes a first dielectric layer 141, a first conductive circuit layer 151, a second dielectric layer 142, a second conductive circuit layer 152, a third dielectric layer 143, a third conductive circuit layer 153, a fourth dielectric layer 144, a fourth conductive circuit layer 154, and a fifth dielectric layer 145.

The first conductive circuit layer 151 may include an interconnection portion 15a and a periphery portion 15b. The interconnection portion 15a is located in the high line density region 16, and the periphery portion 15b is located outside the high line density region 16 (e.g., a low density region). A line width/line space (L/S) of the conductive traces 15' of the interconnection portion 15a may be less than an L/S of the conductive traces 15" of the periphery portion 15b.

The test circuit structure 17 may be disposed adjacent to the interconnection portion 15a of the conductive circuit layer 15. In some embodiments, the wiring structure 1' may include a plurality of interconnection portions 15a, a plurality of test circuit structures 17 and a plurality of shielding walls 155. The interconnection portions 15a, the test circuit structures 17 and the shielding walls 155 may be disposed at a same layer and may be formed concurrently. The test circuit structures 17 and the shielding walls 155 may be located in the high line density region 16.

In some embodiments, the test circuit structures 17 may be dummy, and may be not electrically connected to the interconnection portions 15a of the conductive circuit layer 15. That is, the test circuit structures 17 may be electrically isolated from the interconnection portions 15a of the conductive circuit layer 15. For example, the interconnection portion 15a of the conductive circuit layer 15 may be used to transmitting signals (e.g., digital signals), whereas the test circuit structure 17 does not have the function of transmitting signals (e.g., digital signals).

As shown in FIG. 2, a pattern (or a layout) of the test circuit structure 17 may be similar to or same as a pattern (or a layout) of the interconnection portion 15a of the conductive circuit layer 15. For example, the test circuit structure 17 may include a plurality of segments 171 parallel with each other. A line width/line space (L/S) of the segments 171 of the test circuit structure 17 may substantially equal to the line width/line space (L/S) of the conductive traces 15' of the interconnection portion 15a. Further, the conductive traces 15' of the interconnection portion 15a and the shielding walls 155 may be substantially parallel with the segments 171 of the test circuit structure 17. As shown in FIG. 2 and FIG. 3, the segments 171 of each of the test circuit structures 17 are connected in series with each other. Further, the test circuit structures 17 may be electrically connected with each other through a connection portion 175. As shown in FIG. 3 and FIG. 5, one end of the test circuit structure 17 may be electrically connected to the second surface 12 of the wiring structure 1'. There is no protrusion pad 20 on the test circuit structures 17. The test circuit structure 17 may be free of upward electrical connection.

The protrusion pads 20 may be disposed on and protrude from the first dielectric layer 141 (i.e., the topmost dielectric layer or the outermost dielectric layer) of the wiring structure 1'. The protrusion pads 20 may be disposed on and protrude from the first surface 11 of the wiring structure 1', and extend through the first dielectric layer 141 (i.e., the topmost dielectric layer or the outermost dielectric layer) to electrically connect the first conductive circuit layer 151. The protrusion pads 20 may include a plurality of first protrusion pads 21 and a plurality of second protrusion pads 22.

Figure 15:
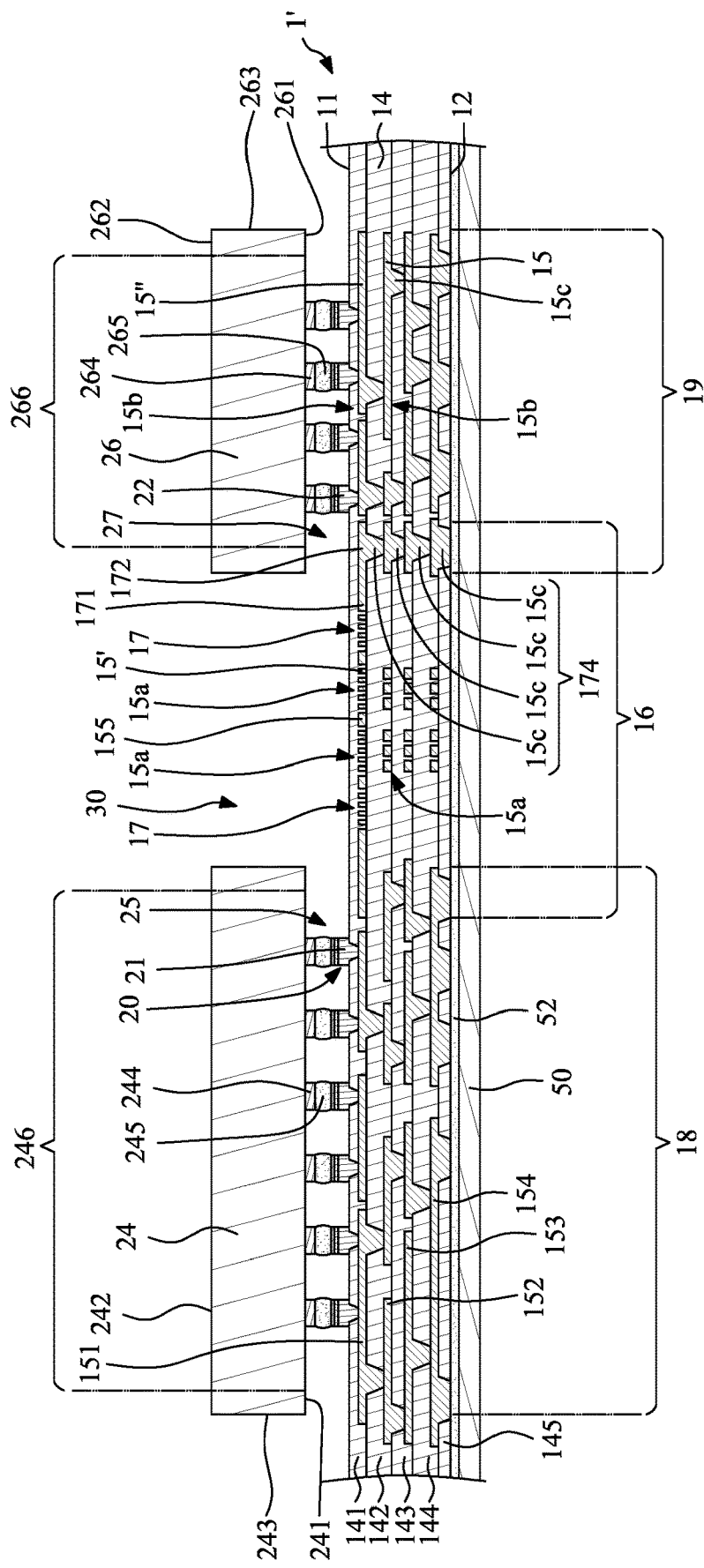
FIG. 15 illustrates one or more stages of an example of a testing method according to some embodiments of the present disclosure.

Referring to FIG. 15, a first electronic device 24 and a second electronic device 26 are electrically connected to the conductive circuit layer 15 of the wiring structure 1' by flip-chip bonding. Thus, the second electronic device 26 may be electrically connected to the first electronic device 24 through the interconnection portion 15a of the conductive circuit layer 15. In some embodiments, the first electrical contacts 244 of the first electronic device 24 may be electrically connected and physically connected to the first protrusion pads 21 through a plurality of solder materials 245. In some embodiments, the second electrical contacts 264 of the second electronic device 26 may be electrically connected and physically connected to the second protrusion pads 22 through a plurality of solder materials 265.

Figure 16:
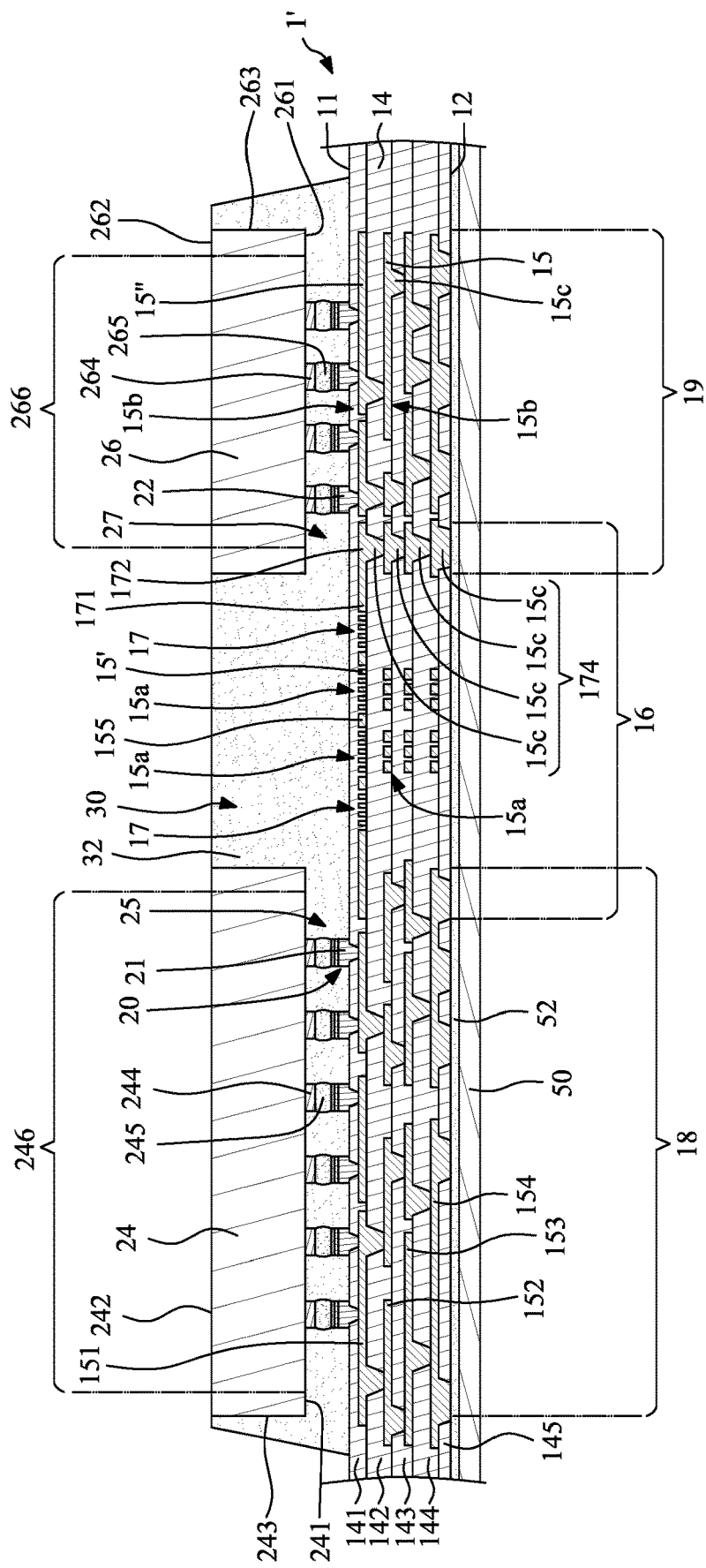
FIG. 16 illustrates one or more stages of an example of a testing method according to some embodiments of the present disclosure.

Referring to FIG. 16, a first protection material 32 (i.e., an underfill) is formed or disposed in a first space 25 between the first electronic device 24 and the wiring structure 1' and a second space 27 between the second electronic device 26 and the wiring structure 1' so as to cover the wiring structure 1', the first electronic device 24 and the second electronic device 26, and protect the joints formed by the first electrical contacts 244, the first protrusion pads 21 and the solder materials 245, and the joints formed by the second electrical contacts 264, the second protrusion pads 22 and the solder materials 265. In addition, the first protection material 32 may further extend into a gap 30 between the lateral surface 243 of the first electronic device 24 and the lateral surface 263 of the second electronic device 26.

Figure 17:
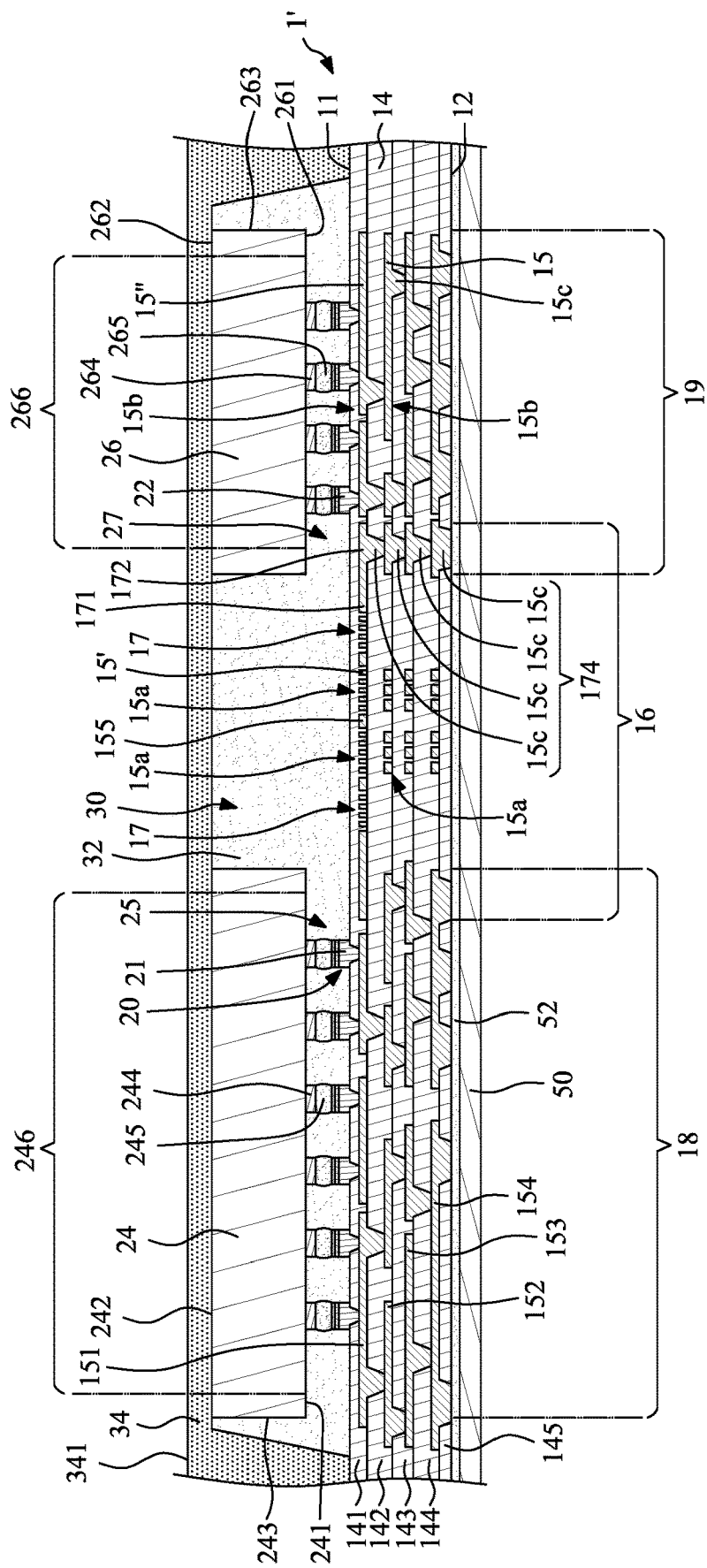
FIG. 17 illustrates one or more stages of an example of a testing method according to some embodiments of the present disclosure.

Referring to FIG. 17, an encapsulant 34 (i.e., a second protection material) is formed or disposed to cover at least a portion of the first surface 11 of the wiring structure 1', at least a portion of the first electronic device 24, at least a portion of the second electronic device 26 and the first protection material 32. The encapsulant 34 has a first surface 341 (e.g., a top surface).

Figure 18:
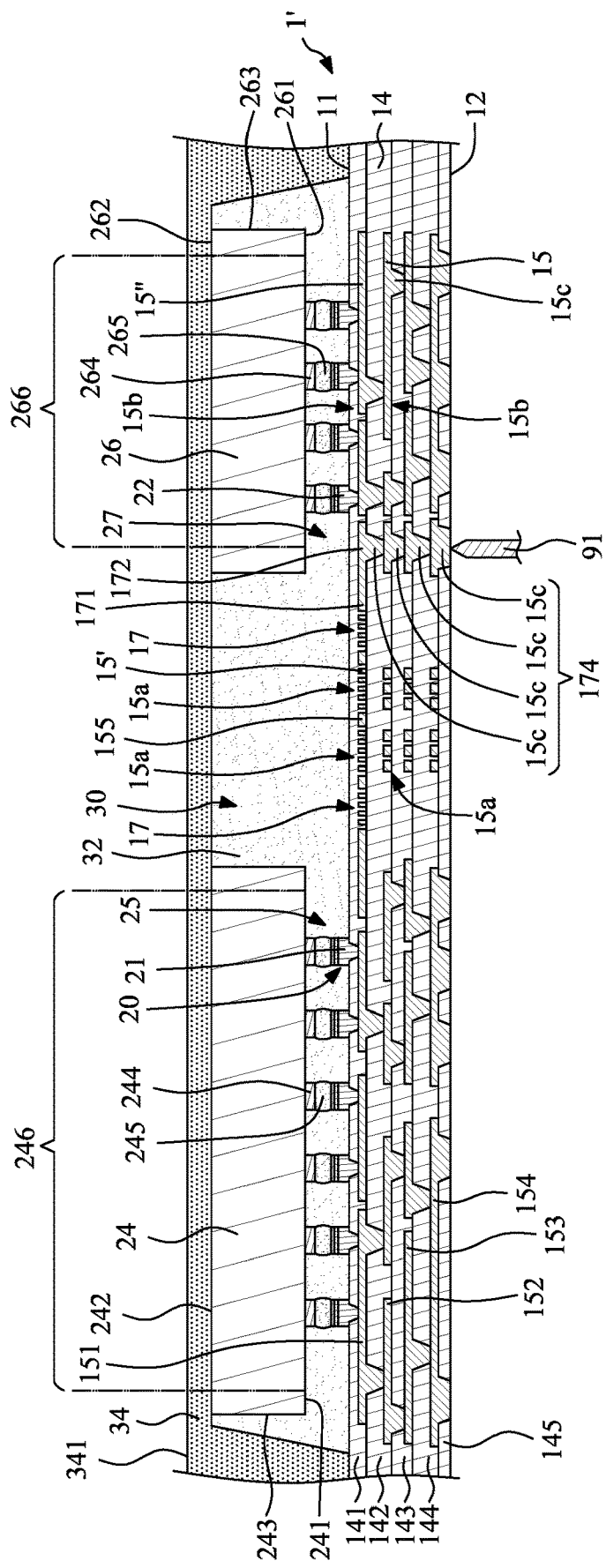
FIG. 18 illustrates one or more stages of an example of a testing method according to some embodiments of the present disclosure.

Referring to FIG. 18, the carrier 50 and the release layer 52 are removed. Thus, the second surface 12 of the wiring structure 1' is exposed, and portions (i.e., the bottom portions of the via portions 15c) of the fourth conductive circuit layer 154 are exposed from the second surface 12 of the wiring structure 1'.

Then, a test may be conducted to the test circuit structure(s) 17 from the second surface 12 (e.g., the bottom surface) of the wiring structure 1' through the downward electrical paths 174, 176. Such test may be an electrical test such as an open/short test as described follows. A first probe 91 and a second probe a testing apparatus are conducted or provided to contact the downward electrical path 174 and the downward electrical path 176 (FIG. 6), respectively. In some embodiments, a testing signal is applied to one of the electrical paths (e.g., the testing signal may be applied to the downward electrical path 174 through the first probe 91), and the other one of the electrical path is grounding (e.g., the downward electrical path 176 may be electrically connected to a ground layer through the second probe). For example, the testing signal may be a testing electrical current. Thus, the testing electrical current may be applied to the downward electrical path 174 through the first probe 91. Then, a voltage between the two electrical paths 174, 176 is measured. The measured voltage may be used to determine whether an open circuit is occurred between the downward electrical paths 174, 176. If an open circuit occurs in the test circuit structure(s) 17, an open circuit may be presumed to occur in the interconnection portion(s) 15a of the conductive circuit layer 15. That is, the interconnection portion(s) 15a of the conductive circuit layer 15 may be assumed to be cracked or broken. Accordingly, the quality of the interconnection portion(s) 15a of the conductive circuit layer 15 may be judged as unqualified or abnormal.

In the present disclosure, since the pattern (or a layout) of the test circuit structure(s) 17 is similar to or same as the pattern (or a layout) of the interconnection portion(s) 15a of the conductive circuit layer 15, the test circuit structure(s) 17 may simulate the condition of the interconnection portion(s) 15a of the conductive circuit layer 15. That is, if the segment(s) 171 of the test circuit structure(s) 17 is cracked or broken, and an open circuit occurs in the test circuit structure(s) 17, the conductive traces 15' of the interconnection portion(s) 15a of the conductive circuit layer 15 may be assumed to be cracked or broken.

It is noted that, as shown in FIG. 7, if the electrical connection end 173 of the outermost segment 171 of one of the test circuit structures 17 is electrically connected to a power/ground path of the wiring structure 1a, the second probe may be omitted.

Figure 19:
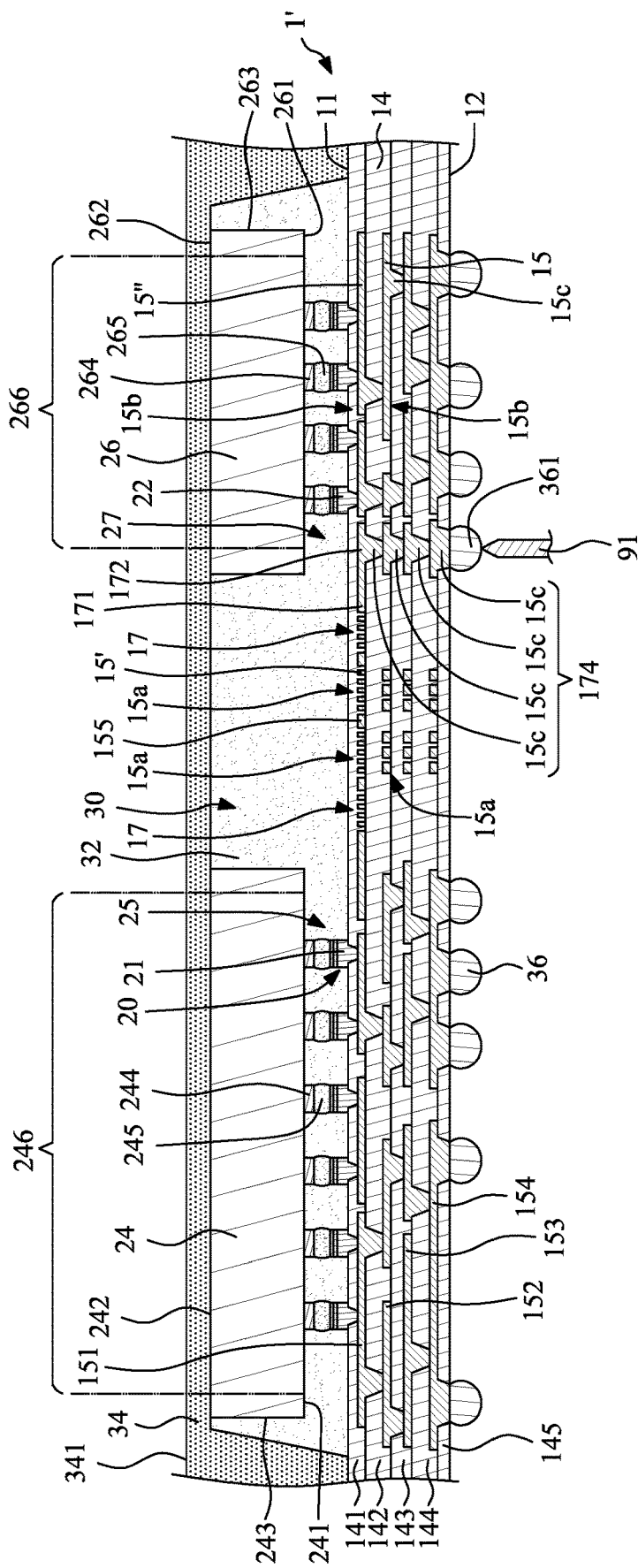
FIG. 19 illustrates one or more stages of an example of a testing method according to some embodiments of the present disclosure.

Referring to FIG. 19, a plurality of solder materials 36 (e.g., solder balls) are formed or disposed to the second surface 12 of the wiring structure 1'. As shown in FIG. 19, the solder materials 36 are disposed on the exposed portions (i.e., the bottom portions of the via portions of the fourth conductive circuit layer 154. In some embodiments, the solder materials 36 may include two test solder materials 361, 362 (FIG. 6). The test solder material 361 is electrically connected to the downward electrical path 174, and the test solder material 362 is electrically connected to the downward electrical path 176. In some embodiments, the above-mentioned test (electrical test) may be conducted on the test solder materials 361, 362 to test the test circuit structure(s) 17. For example, the first probe 91 may contact the test solder material 361, and the second probe may contact the solder material 362.

Figure 20:
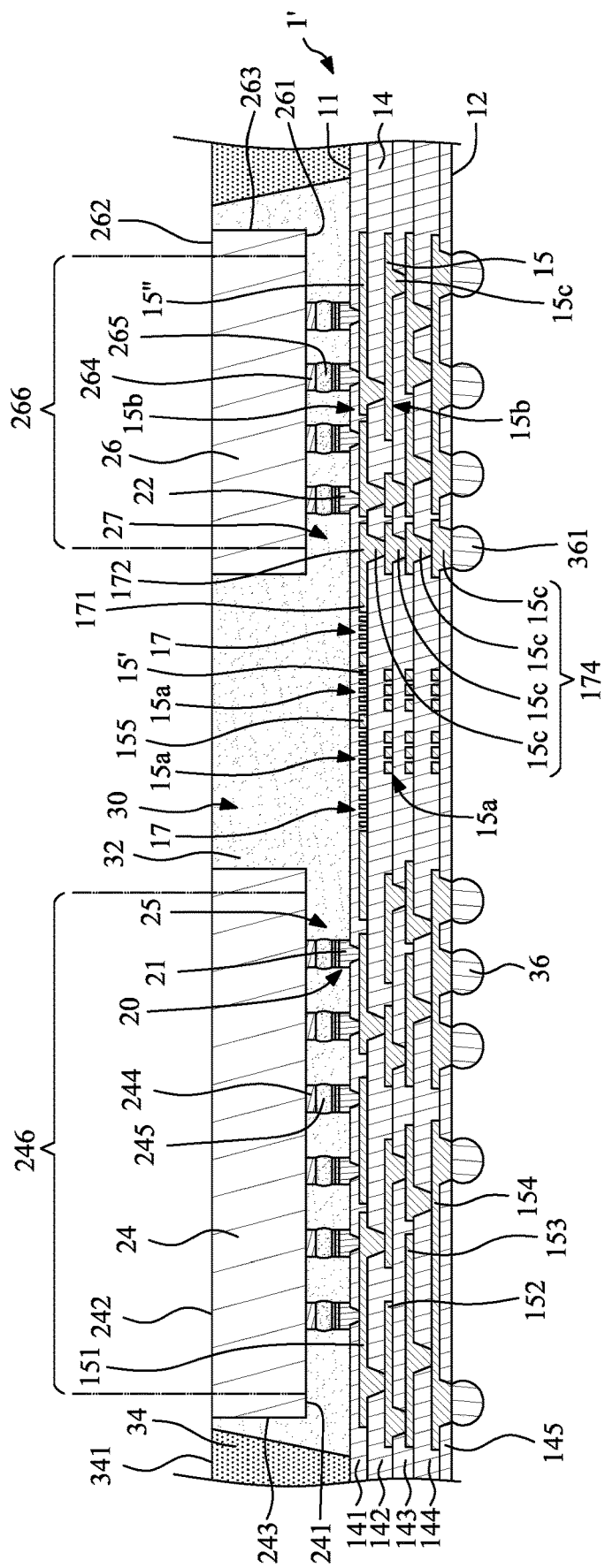
FIG. 20 illustrates one or more stages of an example of a testing method according to some embodiments of the present disclosure.

Referring to FIG. 20, the encapsulant 34 is thinned from its first surface 341. Thus, the first surface 341 of the encapsulant 34, the first backside surface 242 of the first electronic device 24, the second backside surface 262 of the second electronic device 26 and a top surface of the first protection material 32 in the gap 30 may be substantially coplanar with each other.

In some embodiments, a singulation process may be conducted to the wiring structure 1' so as to obtain a plurality of package structures 3 shown in FIG. 1 to FIG. 6.

Figure 21:
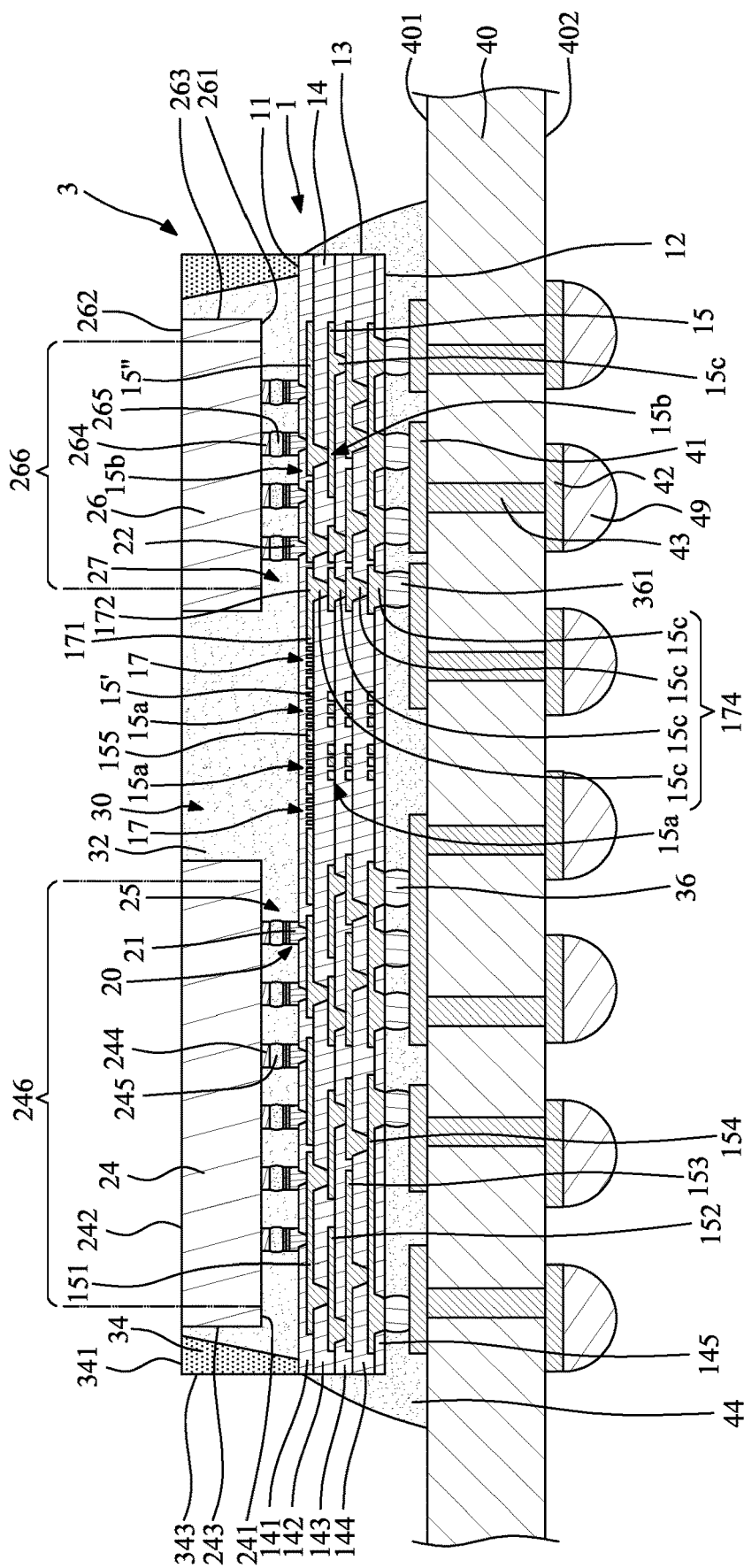
FIG. 21 illustrates one or more stages of an example of a testing method according to some embodiments of the present disclosure.

Referring to FIG. 21, the package structure 3 may be electrically connected to a first patterned circuit 41 of a base substrate 40 through the solder materials 36. The base substrate 40 may have a first surface 401 and a second surface 402 opposite to the first surface 401. The base substrate 40 may include a first patterned circuit 41, a second patterned circuit 42, and a plurality of conductive vias 43. The first patterned circuit 41 may be disposed adjacent to the first surface 401 of the base substrate 40, and the second patterned circuit 42 may be disposed adjacent to the second surface 402 of the base substrate 40. The conductive vias 43 may extend through the base substrate 40 and electrically connect the first patterned circuit 41 and the second patterned circuit 42. Then, a third protection material 44 (i.e., an underfill) is formed or disposed in a space between the package structure 3 and the base substrate 40 so as to cover and protect the solder materials 36 and the first patterned circuit 41.

Then, a heat sink 46 may be attached to the first electronic device 24, the second electronic device 26 and the base substrate 40. In some embodiments, the heat sink 46 may be a cap or hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material. Then, a plurality of external connectors 49 (e.g., solder balls) may be formed or disposed on the second conductive circuit layer 42 for external connection.

In some embodiments, the above-mentioned test (electrical test) may be conducted on the external connectors 49 (on the second surface 402 of the base substrate 40) to test the test circuit structure(s) 17. Then, a singulation process may be conducted to the wiring structure 1' so as to obtain a plurality of assembly structures 4 shown in FIG. 13.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
    a wiring structure including at least one conductive circuit layer and a test circuit structure disposed adjacent to an interconnection portion of the at least one conductive circuit layer;
    a first electronic device electrically connected to the wiring structure; and
    a second electronic device electrically connected to the wiring structure,
    wherein the test circuit structure is not electrically connected to the interconnection portion of the at least one conductive circuit layer.

2. The package structure of claim 1, wherein the test circuit structure includes a segment extending along the interconnection portion.

3. The package structure of claim 2, wherein the segment is non-perpendicular to a conductive trace of the interconnection portion from a top view.

4. The package structure of claim 3, wherein the segment is substantially parallel with the conductive trace of the interconnection portion from the top view.

5. The package structure of claim 1, wherein the test circuit structure includes a first segment disposed at a first side of the interconnection portion and a second segment disposed at a second side of the interconnection portion opposite to the first side.

6. The package structure of claim 5, wherein the first segment is electrically connected to the second segment.

7. The package structure of claim 1, wherein the interconnection portion and the test circuit structure are disposed at a same layer of the wiring structure.

8. The package structure of claim 5, further comprising a connection portion connecting the first segment and the second segment, wherein the interconnection portion is disposed at a first layer of the wiring structure, and the connection portion is disposed at a second layer different from the first layer of the wiring structure.

9. The package structure of claim 1, wherein a line width of a segment of the test circuit structure is substantially equal to a line width of a conductive trace of the interconnection portion.

10. The package structure of claim 1, wherein the test circuit structure includes a plurality of segments, the interconnection portion includes a plurality of conductive traces, and a line space of the plurality of segments is substantially equal to a line space of the plurality of conductive traces.

11. A package structure, comprising:
    a wiring structure including a conductive circuit layer, wherein the conductive circuit layer includes a test circuit structure;
    a first electronic device disposed over the wiring structure; and
    a second electronic device disposed over the wiring structure, wherein the test circuit structure is not electrically connected to the first electronic device and the second electronic device.

12. The package structure of claim 11, wherein in a top view, the test circuit structure is overlapped with the first electronic device or the second electronic device.

13. The package structure of claim 12, wherein in the top view, the test circuit structure is overlapped with a gap between the first electronic device and the second electronic device.

14. The package structure of claim 13, further comprising an underfill overlapped with the gap.

15. The package structure of claim 11, wherein the wiring structure further includes an interconnection portion electrically connecting the first electronic device and the second electronic device, wherein in a top view, the interconnection portion is outflanked by the test circuit structure.

16. A package structure, comprising:
a wiring structure having a first surface and a second surface opposite to the first surface, and including a conductive circuit layer and a test circuit structure disposed adjacent to the conductive circuit layer, wherein the test circuit structure is closer to the first surface than to the second surface, wherein the wiring structure further includes an exposed test via pad exposed from the second surface and electrically connected to the test circuit structure.

17. The package structure of claim 16, further comprising an electronic device disposed over the first surface of the wiring structure.

18. The package structure of claim 17, wherein in a top view, the test circuit structure extends from a region under a projection of the electronic device to outside of the projection of the electronic device.

19. The package structure of claim 16, further comprising a re-flowable material attached to the wiring structure.

20. The package structure of claim 16, further comprising a protection material disposed more adjacent to the test circuit structure than to the exposed test via pad.

* * * * *